United States Patent
John et al.

(10) Patent No.: US 6,589,334 B2
(45) Date of Patent: Jul. 8, 2003

(54) PHOTONIC BAND GAP MATERIALS BASED ON SPIRAL POSTS IN A LATTICE

(75) Inventors: Sajeev John, Mississauga (CA); Ovidiu Toader, 604 Spadina Ave., #303, Toronto Ontario (CA), M5S 2H4

(73) Assignees: John Sajeev, Mississauga (CA); Ovidiu Toader, Toronto (CA)

(*) Notice: Subject to any disclaimer, the term of this patent is extended or adjusted under 35 U.S.C. 154(b) by 0 days.

(21) Appl. No.: 09/988,386

(22) Filed: Nov. 19, 2001

(65) Prior Publication Data

US 2002/0059897 A1 May 23, 2002

Related U.S. Application Data

(60) Provisional application No. 60/249,278, filed on Nov. 17, 2000.

(51) Int. Cl.[7] .............................................. C30B 25/02
(52) U.S. Cl. ............................... 117/84; 117/1; 117/2
(58) Field of Search ......................... 117/1, 2, 84

(56) References Cited

U.S. PATENT DOCUMENTS 5,187,461 A * 2/1993 Brommer et al. ........ 333/219.1
5,471,180 A * 11/1995 Brommer et al. ........... 333/202

* cited by examiner

*Primary Examiner*—Felisa Hiteshew
(74) *Attorney, Agent, or Firm*—Lynn C. Schumacher; Hill & Schumacher

(57) ABSTRACT

The present invention relates to photonic band gap (PBG) materials and more specifically, it describes a new type of photonic crystal structure which exhibits a large and complete three-dimensional PBG. This PBG is highly robust to the effects of disorder. The photonic crystal has a tetragonal or hexagonal lattice symmetry and is comprised of a lattice of polygonal spiral posts of a high refractive Index material in a low index background. The corresponding inverse structure comprises a lattice of low refractive index posts in a high refractive index background also has a very large PBG. These new photonic crystals exhibit very large (up to 23.6% when made of silicon and nearly 29% when made of germanium) complete 3D photonic band gaps. The posts exhibit a spiral profile and all the spiral posts wind in phase with each other. The identity of the winding phase from one post to the next makes the present invention amenable to micro-fabrcation using the Glancing Angle Deposition (GLAD). The present, invention provides a blueprint whereby the GLAD technique can be adapted to synthesize these new types of PBG materials. These materials have applications in lightwave technologies.

48 Claims, 26 Drawing Sheets

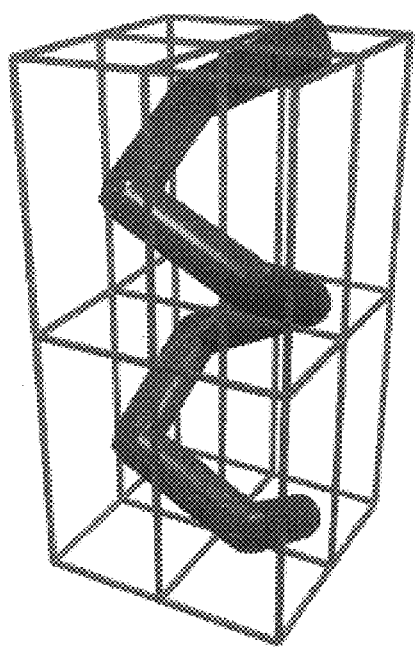
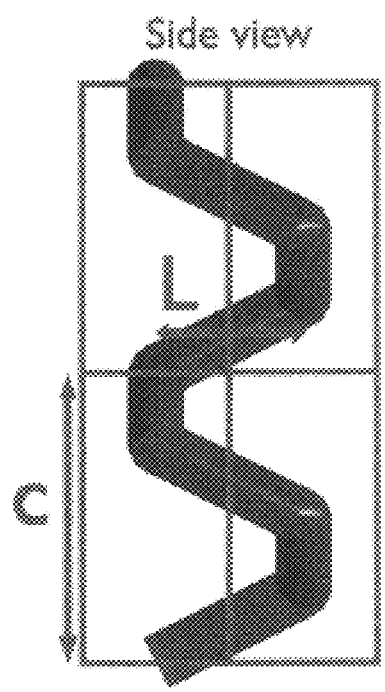
FIG. 5(a)     FIG. 5(b)
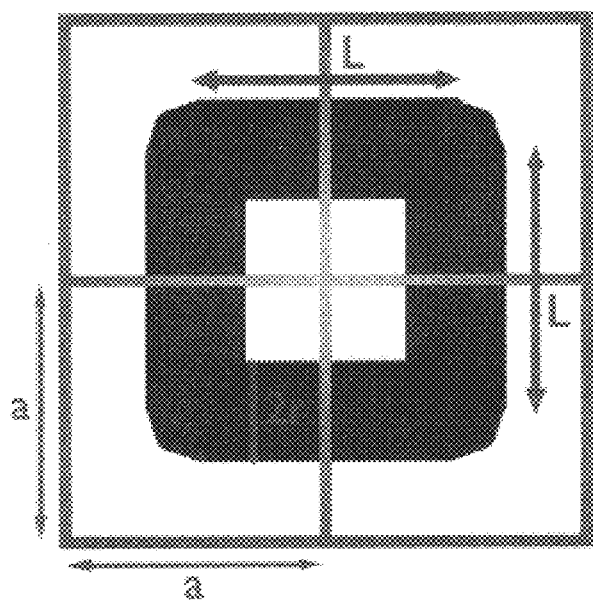
FIG. 5(c)

PHOTONIC BAND GAP MATERIALS BASED ON SPIRAL POSTS IN A LATTICE

CROSS REFERENCE TO RELATED U.S PATENT APPLICATION

This patent application relates to U.S. provisional patent application Serial No. 60/249,278 filed on Nov. 17, 2000 entitled PHOTONIC BAND GAP MATERIALS BASED ON SPIRAL POSTS IN A TETRAGONAL LATTICE.

FIELD OF THE INVENTION

The present invention relates to photonic band gap (PBG) materials and methods of production, and more particularly the present invention describes a set of new classes of photonic crystal structures which exhibit large and complete three-dimensional PBGs and which are amenable to large scale micro-fabrication.

BACKGROUND OF THE INVENTION

Photonics is the science of molding the flow of light. Photonic band gap (PBG) materials, as disclosed in S. John, *Phys. Rev. Lett.* 58, 2486 (1987), and E. Yablonovitch, *Phys. Rev. Lett.* 58, 2059 (1987), are a new class of dielectrics which carry the concept of molding the flow of light to its ultimate level, namely by facilitating the coherent localization of light, see S. John, *Phys. Rev. Lett.* 53, 2169 (1984), P. W. Anderson, *Phil. Mag. B* 52, 505 (1985), S. John, *Physics Today* 44, no. 5, 32 (1991), and D. Wiersma, D. Bartolini, A. Lagendijk and R. Righini, *Nature* 390, 671 (1997). This provides a mechanism for the control and inhibition of spontaneous emission of light from atoms and molecules forming the active region of the PBG materials, and offers a basis for low threshold micro-lasers and novel nonlinear optical phenomena. Light localization within a PBG facilitates the realization of high quality factor microcavity devices and the integration of such devices through a network of microscopic wave-guide channels (see J. D. Joannopoulos, P. R. Villeneuve and S. Fan, *Nature* 386,143 (1998)) within a single all-optical microchip. Since light is caged within the dielectric microstructure, it cannot scatter into unwanted modes of free propagation and is forced to flow along engineered defect channels between the desired circuit elements.

PBG materials, infiltrated with suitable liquid crystals, may exhibit fully tunable photonic band structures [see K. Busch and S. John, *Phys. Rev. Lett.* 83, 967 (1999) and E. Yablonovitch, *Nature* 401, 539 (1999)] enabling the steering of light flow by an external voltage. These possibilities suggest that PBG materials may play a role in photonics, analogous to the role of semiconductors in conventional microelectronics. As pointed out by Sir John Maddox, "If only it were possible to make dielectric materials in which electromagnetic waves cannot propagate at certain frequencies, all kinds of almost magical things would be possible." John Maddox, *Nature* 348, 481 (1990).

The four major categories of 3-d PBG materials, which have been disclosed, can be classified according to the frequency bands between which a full photonic band gap appears. The number of frequency bands below the full PBG depends on the size of the unit cell in which the periodic (repeating) lattice structure is defined. For example, a lattice with a given periodically repeated unit cell can be alternatively described with a larger unit cell which has twice the size (volume) of the originally chosen unit cell. In the second (equivalent) description, the number of bands that appears below the full photonic band gap would be double the number of bands that appears below the full PBG in the original description and each of the bands in the second description would contain half the number of electromagnetic modes when compared to the bands in the original description. In identifying the categories of 3D PBG materials, we exclude categories that arise purely from such changes in the definition of the unit cell. By making use of the smallest possible unit cell for a given photonic crystal structure, we identify four distinct categories of PBG materials disclosed previously:

In the first category (category 1) are PBG materials which exhibit a complete PBG between the eighth and ninth bands of the photonic band structure. This includes the Bravais (one scatterer per unit cell) lattices of spheres such as the face centered cubic (FCC) lattice, the hexagonal close packed (HCP) lattice, the body centered cubic (BCC) lattice, and minor variations of these structures. These PBG materials generally exhibit a small (less than 10%) PBG between the eighth and ninth bands but are accompanied by large pseudo-gaps (a frequency range in which the photon density of states is strongly suppressed but does not vanish) between lower bands. This category entails the widely studied inverse opal structures, see for instance S. John and K. Busch, *IEEE Journal of Lightwave Technology* 17,1931 (1999). The PBG materials associated with category one generally have gaps which are not robust and which collapse under moderate amounts of disorder. On the other hand, the high sensitivity of this PBG to small perturbations can be utilized to achieve complete tunability of the gap as disclosed by K. Busch and S. John, *Physical Review Letters* 83, 967 (1999).

In the second category (category 2), are PBG materials which exhibit a complete gap between the second and third bands (sometimes referred to as the fundamental gap) of the photonic band structure. This includes the diamond lattice of spheres, the inverse diamond lattice (see K. M. Ho, C. T. Chan, and C. M. Soukoulis, *Physical Review Letters* 65, 3152 (1990)), the tetrahedral network of rods on a diamond lattice (see C. T. Chan, S. Datta, K. M. Ho, and C. M. Soukoulis, *Physical Review B* 50,1988 (1994)), the Yablonovite structure (see E. Yablonovitch, T. J. Gmitter, and K. M. Leung, *Physical Review Letters* 67, 2295 (1991)), and the woodpile structure (see S. Y. Lin and J. G. Fleming, *IEEE Journal of Lightwave Technology* 17,1944 (1999) and S. Noda et. al *IEEE Journal of Lightwave Technology* 17,1948 (1999)). PBG materials in this category generally have very large gaps (20%–30%) and the gap is highly robust to disorder effects. However, micro-fabrication of category 2 structures has thus far been very limited due to complexity and expense.

In the third category (category 3) are PBG materials which exhibit a complete gap between the fifth and sixth bands of the photonic band structure. These include simple cubic mesh structures as disclosed by H. Sozuer and J. W. Haus, *Journal of the Optical Society of America B* 10, 296 (1993). All structures in category 3, which have been disclosed so far, exhibit relatively small (less than 10%) photonic band gaps.

In the fourth category (category 4) are PBG materials which exhibit a complete gap between the fourth and fifth bands of the photonic band structure.

Following the initial disclosure of the photonic band gap concept (S. John, *Phys. Rev. Lett.* 58, 2486 (1987), and E. Yablonovitch, *Phys. Rev. Lett.* 58, 2059 (1987)), it was suggested that a diamond lattice of high refractive index spheres in air as well as the inverse diamond lattice , consisting of overlapping air spheres in a high refractive index background, would provide a large three-dimensional PBG, see K. M. Ho, C. T. Chan, and C. M. Soukoulis, *Physical Review Letters* 65, 3152 (1990). While the theoretical demonstration of a large PBG in the inverse diamond lattice was an important milestone in the field, the proposed structure has proven impractical from a micro-fabrication point of view. A number of structures, related to the inverse diamond lattice, were later proposed to circumvent the micro-fabrication barrier. These include the Yablonovite (see E. Yablonovitch, T. J. Gmitter, and K. M. Leung, *Physical Review Letters* 67, 2295 (1991)) structure and the woodpile structure (see S. Y. Lin and J. G. Fleming, *IEEE Journal of Lightwave Technology* 17,1944 (1999) and S. Noda et. al *IEEE Journal of Lightwave Technology* 17,1948 (1999)). Each of these structures mimics the diamond lattice, and like the diamond lattice exhibits a large 3D PBG between the second and third bands in the photonic band structure. These structures belong to a different category from the inverse opal (face centered cubic lattice) structures which exhibit a comparatively small (5%–9% in the case of a silicon inverse opal) 3-d PBG between the eighth and the ninth bands of the photonic band structure.

In addition to these structures, a theoretical blueprint for certain circular spiral post structures has been disclosed, [see A. Chutinan and S. Noda *Phys. Rev. B*, 57, R2006–R2008 (1998)]. These circular spiral posts may be arrayed in either a body centered cubic (BCC), face centered cubic (FCC), or simple cubic (SC) lattice structure. The FCC and BCC structures, are based on visual similarity to the diamond lattice. In both of these structures, the spiral rods are arranged in a lattice but adjacent spiral rods are mutually half period shifted as the rods wind in the vertical direction. These structures are predicted to have a photonic band gap between the second and third bands in the photonic band structure. Chutinan and Noda have disclosed a particular set of geometrical parameters for which the FCC circular spiral photonic crystal exhibits a PBG which is comparable in size to the inverse diamond lattice. However, micro-fabrication of the FCC circular spiral structure has thus far been impractical. Novel deposition methods such as Glancing Angle Deposition (GLAD) [see K. Robbie and J. Brett, *Nature* 384, 616 (1996)] cannot be readily applied to this structure due to the half period shift between adjacent spiral rods. Another method involves three-dimensional lithography using a two-photon confocal microscope [see Cumpston et. al. *Nature* 398 51–54 (1999)]

Neither the FCC circular spiral nor the inverse diamond lattice have been synthesized up to now. The corresponding PBG for the BCC circular spirals is smaller than that of the FCC circular spirals and it also occurs between the second and third bands of the photonic band structure. However, micro-fabrication of the BCC circular spiral is also impractical for the same reasons stated for the FCC circular spiral. The simple cubic (SC) circular spiral structure is distinct from either the FCC or BCC circular spiral structures. In the SC circular spiral, the adjacent spiral rods are not half period shifted from each other and the PBG appears between the fourth and fifth bands of the photonic band structure rather than between the second and third bands. Chutinan and Noda have disclosed a 16.8% PBG in a SC circular spiral structure in which the background material has a dielectric constant of 12.25 and the rods consist of air. A tetragonal circular spiral structure can be visualized by considering the SC circular spiral structure and stretching the spiral rods along the vertical direction such that the periodicity in the vertical direction no longer coincides with the periodicity in the plane perpendicular to the rod axes. Chutinan and Noda have disclosed only one case of a tetragonal circular spiral structure for which the PBG (of 3%) is negligibly small. An attempt to improve on the Chutinan-Noda structure has been disclosed by Y-C. Tsai, J. B. Pendry, and K. W-K. Shung, *Physical Review B* 59, R10401 (1999) using various woven dielectric fiber structures. However, the maximum gaps disclosed in this improvement are no larger than 7%.

SUMMARY OF THE INVENTION

The present invention relates to photonic band gap (PBG) materials and more specifically, it describes a set of new classes of photonic crystal structures which exhibit a large and complete three-dimensional PBG. This PBG is highly robust to the effects of disorder. The photonic crystal has a tetragonal or other lattice symmetry and is comprised of a lattice of square or other polygonal spiral posts of a high refractive index material in a low index background. The corresponding inverse structure comprised of a lattice of low refractive index posts in a high refractive index background also has a very large PBG.

In the present invention, the inventors present for the first time a process for producing a broad range of spiral structures exhibiting very large complete 3-d photonic band gaps (up to 23.6% when made of silicon and nearly 29% when made of germanium). In a preferred embodiment of the present invention the posts exhibit a square spiral profile. All the square spiral posts wind in phase with each other i.e. there is no phase shift between adjacent rods. The identity of the winding phase from one post to the next makes the present invention amenable to micro-fabrication using the GLAD method. In a non-limiting example of the present invention, there is provided a three-dimensional lattice having tetragonal symmetry and a PBG occurs between the fourth and fifth bands of the photonic band structure. The present invention is a major new development in the identification of PBG materials with large photonic band gaps in the near-infrared (1.5 micron wavelength) and visible spectral regions and which are amenable to inexpensive, rapid, large scale manufacturing. We disclose, for the first time, a set of novel, broad ranges of specific geometrical parameters for micro-fabrication of materials with a very large PBG. These crystals can be fabricated using a technique called Glancing Angle Deposition (GLAD), [see K. Robbie and J. Brett, *Nature* 384, 616 (1996)], or a technique involving two-photon confocal microscopy, [see Cumpston et. al. *Nature* 398 51–54 (1999)], but is not limited to these techniques. The present invention provides a blueprint whereby these or other techniques can be adapted to synthesize these new types of PBG materials. These materials have applications in a variety of lightwave technologies.

In one aspect of the invention there is provided a photonic crystal, comprising:

a three dimensional crystal lattice including a plurality of substantially square, triangular, or other multi-sided (polygonal) spiral posts having a first refractive index arranged in a material having a second refractive index, said three dimensional crystal lattice having tetragonal, hexagonal, or other symmetry; and said first and second refractive indexes being sufficiently different from each other so that said photonic crystal has a complete three-dimensional photonic band gap.

In another aspect of the invention there is provided a method of producing a photonic crystal, comprising a three dimensional crystal lattice including a plurality of substantially square, triangular, or other multi-sided (polygonal)

spiral posts having a first refractive index arranged in a material having a second refractive index, said three dimensional crystal lattice having tetragonal or other symmetry, wherein said first and second refractive indexes are sufficiently different from each other so that said photonic crystal has a complete three-dimensional photonic band gap, the method comprising:

etching of a flat surface (substrate) with a two-dimensional periodic lattice of vertical seed posts whose height is roughly one-quarter of the spacing between the seed posts; said seed posts arranged in a square, triangular, honeycomb, or other lattice; orienting said substrate at a pre-selected angle to a vapor flux containing said first material such that said pre-selected angle facilitates a shadowing of the substrate by the seed posts and the subsequent exposure of the posts (and not the spaces between the posts) to the vapor flux, depositing said first material using glancing angle deposition onto said seed posts, rotating the substrate and seed posts at pre-selected time intervals and to pre-selected orientations , and thereby growing spiral posts comprising said first material which wind about a z-axis in phase with each other.

heating and compressing a photonic crystal template consisting of a lattice of spiral posts, depositing a further amount of said first material uniformly on all exposed surfaces of said spiral posts so as to increase the thickness of the arms of said spiral posts, infiltrating the air regions between the resulting spiral posts in a uniform manner with said second material, selectively etching (removing) said first material and thereby creating spiral posts comprising air embedded in said second material.

BRIEF DESCRIPTION OF THE DRAWINGS

The photonic crystals having large photonic band gaps produced in accordance with the present invention will now be described, by way of example only, reference being made to the accompanying drawings, in which:

FIG. 5a is a perspective view of a building block of the square spiral photonic crystal; FIG. 5b is a side view of the building block shown in FIG. 5a; and FIG. 5c is a top view of the building block shown in FIG. 5a. The tetregonal lattice is characterized by lengths a and c. The geometry of the square spiral is characterized by its width, L, pitch c; and radius of the arm, r. For clarity a single spiral is shown coiling around in 4 unit cells.

DETAILED DESCRIPTION OF THE INVENTION

DEFINITIONS

The photonic band gap materials based on spiral posts described by this invention are classified in terms of 10 distinct classes of structures but are not limited to these 10 classes. These classes serve the purpose of illustration. The illustrated classes as well as more general classes of 3-d PBG materials can be generated from the Algorithm described below, consisting of:
choosing a 3-d Bravais or non-Bravais lattice,
cutting said 3-d lattice with an oriented 2-d plane that intersects a periodic (2-d) array of lattice points of said 3-d lattice,
placing seed posts on a substrate whose surface coincides with said 2-d array of lattice points,
constructing a starting template of spiral posts (starting from the seed posts) whose arms connect specified points of said 3-d lattice, and
varying the position of the spiral arms and their elbows in the local vicinity of said 3-d lattice points.

Said Algorithm is not unique, but provides a convenient relation between the spiral photonic band gap materials of the present invention and some underlying three-dimensional (parent) lattice of points. In some cases, the "elbow" points of the optimized spiral posts may differ considerably from said parent lattice.

Figure 3:
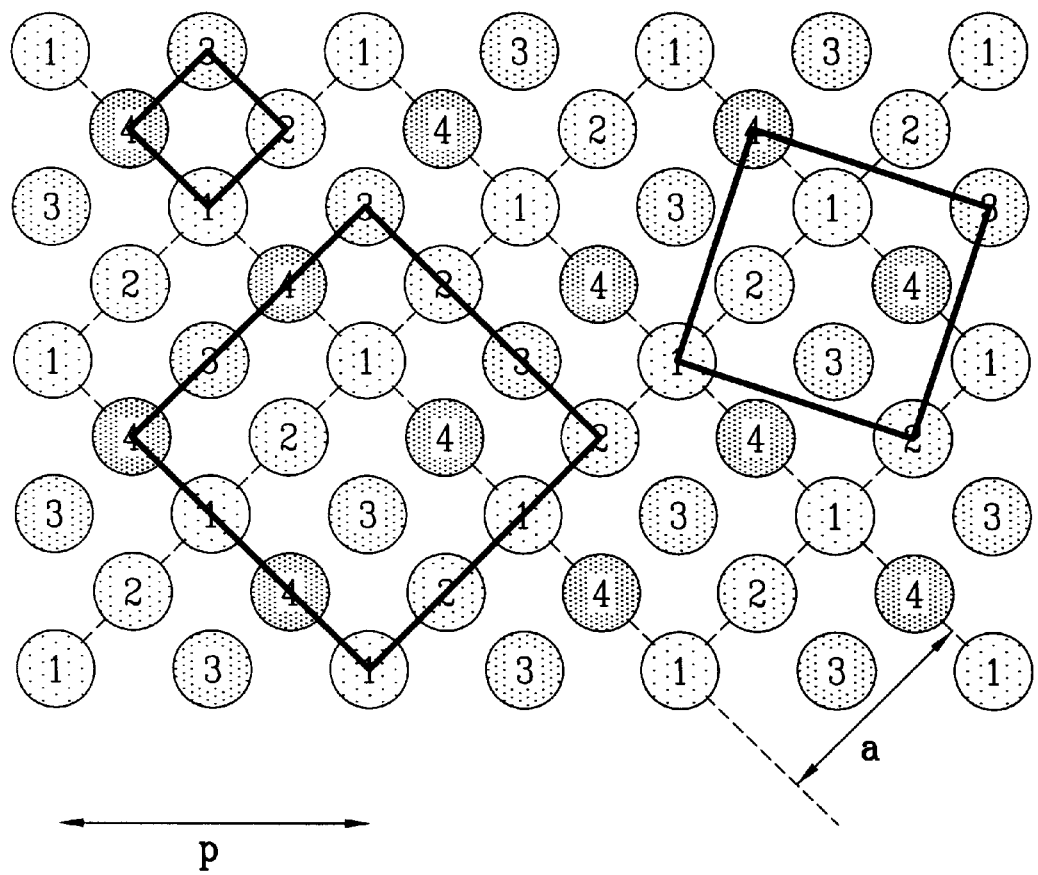
FIG. 3 shows an illustration of various (1,0,0) diamond GLAD-n structures. The square lattice formed by the seeds on the substrate is Illustrated by the dashed lattice characterized by lattice constant a. p is the lattice constant of the conventional diamond unIt cell. An example of GLAD-1 spiral is shown in the top left side of the figure. GLAD-3 is shown in the top right and (GLAD-5 is shown in the lower center area. The numerical label on each circle represents the horizontal plane on which said circle lies; circles with larger numbers occuring in planes further above the substrate. The spiral post winds from a circle on layer 1, to a circle on layer 2, to a circle on layer 3, to a circle on layer 4, and then to a circle that lies directly above the first circle.

More specifically, the positions of the original seed posts that are etched on the underlying substrate prior to glancing angle deposition (GLAD) are given by the intersection of an oriented two-dimensional plane which cuts through a three dimensional lattice of points and intersects the points of said three-dimensional lattice. The orientation of said plane is defined by a crystallographic axis vector with components $(m_1,m_2,m_3)$ of the three-dimensional lattice (said axis vector to be identified with the z-axis of the spiral photonic crystal) such that said axis vector is normal (perpendicular) to said plane. The spiral posts grown by the GLAD method are chosen to wind around the axis defined by the vector $(m_1,m_2,m_3)$. The arms of the spiral posts are chosen initially to connect the points of the three-dimensional lattice and the turning points (elbows) of the spiral are chosen initially to coincide with points of the three-dimensional lattice. For a given three-dimensional lattice and a given axis $(m_1,m_2,m_3)$, there are distinct classes of spiral posts defined by the distance between points of said lattice which are joined by the arms of the spiral. A class n spiral (see FIG. 3) is defined with arms that, in a straight line path, connect $n^{th}$ nearest neighbor points of the three-dimensional lattice. At each endpoint of the arm, the spiral forms an elbow to another arm that causes the spiral post to wind around the z-axis and connect said endpoint to its $n^{th}$ nearest neighbor point on the three-dimensional lattice. This invention provides illustrations of, but is not limited to, class 1 spirals, class 3 spirals and class 5 spirals.

The spiral structure within a given class is further defined by three parameters: L, the projection of the spiral arm length (distance between a pair of elbows) onto the plane of the substrate, c, the length along the z-axis of the repeating (unit) cell, and r, the radius of the circular cross section of the arm. In cases where the cross section of the spiral arm is non-circular, the parameter, r, is replaced with alternative descriptive parameter(s). For a given class of spiral, the set of parameters (L,c,r) (for which a complete three-dimensional photonic band gap exists) defines an "island" within the larger set of spirals spanned by all L,c, and r. Said "island" may include spirals whose elbows occur precisely on the points of said three-dimensional lattice as well as "distorted" spirals obtained by various compressions or elongations of the spiral arms in which said elbows do not occur precisely on the points of said three-dimensional lattice.

In this invention, the label $(m_1,m_2,m_3)$-"3-d lattice"-GLAD-n spiral is used to denote the class of spiral photonic crystals whose z-axis is given by the $(m_1,m_2,m_3)$ crystallographic axis of a specified "3-d lattice". The acronym GLAD in said label indicates that said spiral photonic crystal consists of a lattice of spiral posts that wind together in phase such that all posts can be synthesized simultaneously by the method of glancing angle deposition and for which there is a 1:1 correspondence between the number of lattice points of said 3-d lattice and the number of elbows of the spiral photonic crystal. When the term "GLAD" is not contained in the label, the photonic crystal may contain spiral posts that are phase shifted relative to one another, rotated relative to one another or that are otherwise non-identical to each other under pure translation of one spiral along the surface of the substrate. The label $(m_1,m_2,m_3)$-"3-d lattice"-GLAD-n, denotes a photonic crystal in which the spiral posts have a higher refractive index (direct structure) than the background refractive index. The label Inverse-($m_1,m_2,m_3$)-"3-d lattice"-GLAD-n denotes a photonic crystal in which the spiral posts have a lower refractive than the background refractive index.

This invention includes, but is not limited to, "3-d lattice" structures which are face center cubic (FCC), diamond, and distorted diamond (DD). The FCC lattice consists of points at each of the corners of repeating unit cubes of side length p as well as all points at the center of each face of said cubes. The diamond lattice consists all points of said FCC lattice plus the set of all points obtained by adding the vector (p/4.p/4,p/4) to each of the points of said FCC lattice. A particular embodiment of the distorted diamond (DD) lattice which we label as DD3, consists of all points of said FCC lattice plus the set of all points obtained by adding the vector (p/3,p/3,p/3) to each of the points of said FCC lattice. This invention includes, but is not limited to spiral photonic crystals whose crystallographic axis vectors are given by $(1,0,0)^1$, and (1,1,1). This invention includes, but is not limited to GLAD-1, GLAD-3 and GLAD-5 spiral photonic crystals. This invention includes both inverse and direct structures. More explicitly, this invention includes, but is not limited to, the spiral photonic crystals labeled as:

(1,0,0)-FCC-GLAD-1,

Inverse-(1,0,0)-FCC-GLAD-1, (1,0,0)-diamond-GLAD-1,

Inverse-(1,0,0)-diamond-GLAD-1, (1,0,0)-diamond-GLAD-3,

Inverse-(1,0,0)-diamond-GLAD-3, (1,0,0)-diamond-GLAD-5,

Inverse-(1,0,0)-diamond-GLAD-5, (1,1,1)-DD3-GLAD-1,

Inverse-1,1,1)-DD3-GLAD-1 and each of their respective "islands" in the parameter space defined by values of L, c, and r (or other equivalent parameters) that yield nonzero photonic band gaps. It is understood that as L and c are allowed to vary within a given "island", the elbows of the spiral do not always coincide with the points of the original "3-d lattice" nor do the arms of the spiral always join points of the original "3-d lattice". Rather, the "3-d lattice", whether it is FCC, diamond, or distorted diamond (DD), serves only as a starting template from which to construct the spiral photonic crystal. It is understood that a variety of additional classes of spiral photonic crystals with or without full 3-d photonic band gaps may be generated using the Algorithm described above.

This invention provides a detailed blueprint for microfabrication of a variety of new classes of three-dimensional photonic band gap materials consisting of a lattice of spiral posts. A particularly significant subset of classes are those photonic crystals consisting of square spiral posts in a tetragonal lattice. These square spiral photonic crystals exhibit a very large and complete three-dimensional photonic band gap. These square spiral photonic crystals include the (1,0,0)-diamond-GLAD-1 class, the Inverse (1,0,0)-diamond-GLAD-1 class, the (1,0,0)-diamond-GLAD-5, the Inverse (1,0,0)-diamond-GLAD-5 class, the inverse (1,0,0)-diamond-GLAD-3 class, and the Inverse (1,0,0)-FCC-GLAD-1 class. This invention also provides a detailed description of the electromagnetic properties of these novel 3-d photonic microstructures. For these photonic crystals, the 3-d photonic band gap is highly robust to the effects of structural disorder. The structure of the photonic crystal is described in terms of a set of geometrical parameters and the optimum set of parameters leading to the maximum full photonic band gap is determined. In the case of (1,0,0)-diamond-GLAD-5, when the lattice of square spiral posts is made of silicon and is surrounded by an air background, the photonic crystal exhibits a 16.2% full photonic band gap.

The corresponding "inverted structure" consisting of a lattice of square spiral air posts in a silicon background (Inverse (1,0,0)-diamond-GLAD-5) exhibits a 23.6% full photonic band gap. The threshold refractive index contrast between the square spiral posts and the background required for the creation of a complete three-dimensional PBG for these photonic crystals is about 2.20. These photonic crystals are amenable to microfabrication using the glancing angle deposition (GLAD) method.

Microfabrication of three dimensional photonic crystals with band gaps centered at a wavelength shorter than 2 microns poses a great challenge. The microscopic structure of such a crystal should generate a large gap and at the same time lend itself to inexpensive and efficient synthesis. The glancing angle deposition GLAD method [see K. Robbie and J. Brett, *Nature* 384, 616 (1996)] is a relatively new technique which has been used to successfully engineer three dimensional thin film micro-structures on sub micrometer scales. While complex three dimensional structures can be fabricated by combining oblique vapor deposition and substrate motion in the GLAD process, the method has never before been applied to PBG materials synthesis.

Figure 1A:
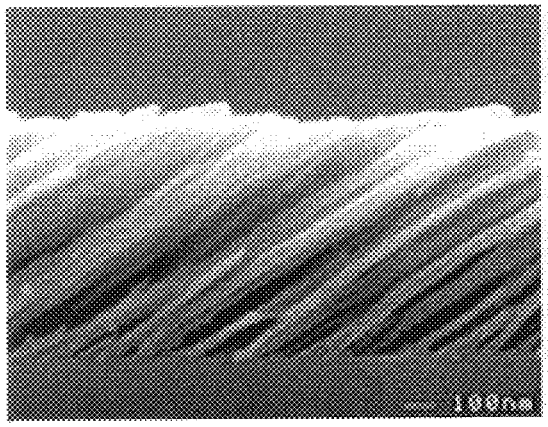
FIG. 1 shows prior art scanning electron micrographs of materials grown by glancing angle deposition (GLAD) method.
Figure 1B:
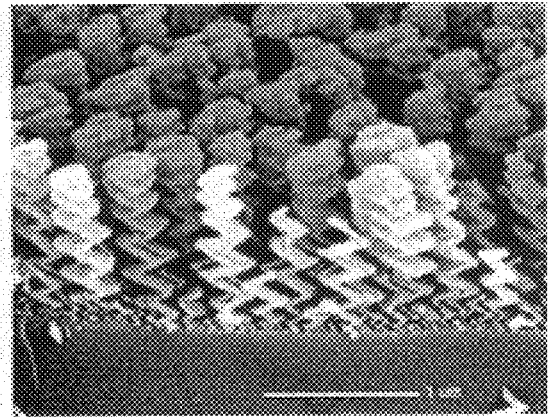
Figure 1C:
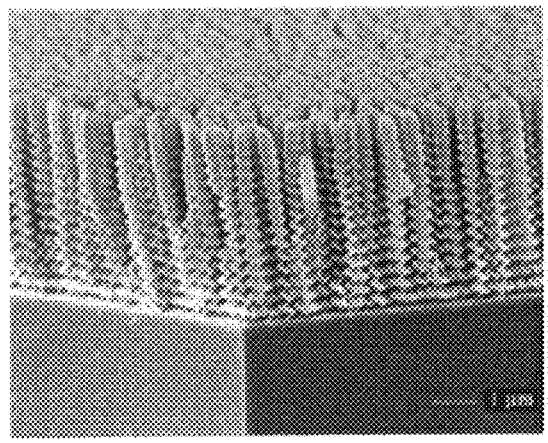
Figure 1D:
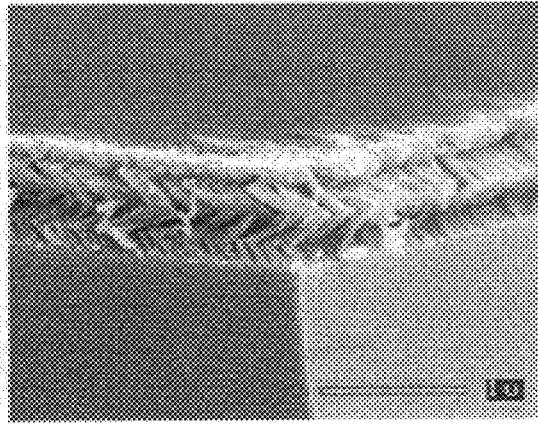
Figure 2A:
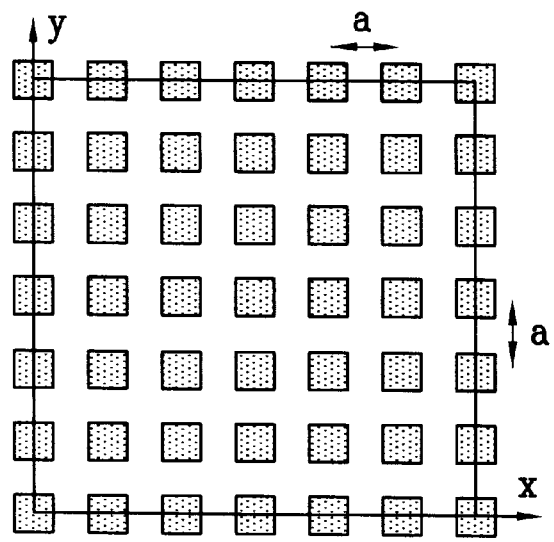
FIG. 2 shows prior art glancing angle deposition (GLAD) methodology. The Glancing Angle Deposition (GLAD) requires the preparation of a lattice of seed posts on a suitable substrate (a). The normal to the surface (defined as the z-axis of the photonic crystal) is depicted in this Figure as coinciding with the (1,0,0) crystallographic axis of the diamond lattice. The plane normal to the (1,0,0) axis of diamond, intersects a square lattice of points of the diamond lattice. The seed posts (blue squares) are centered on these points of intersection. (b) A vapor is deposited Man oblique angle B leading to growth of posts (a) in a predetermined direction characterized by the growth angle a. Computer controlled motion of the substrate leads to growth of complex spiral posts.
Figure 2B:
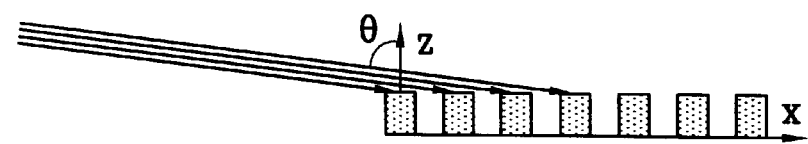
Figure 2C:
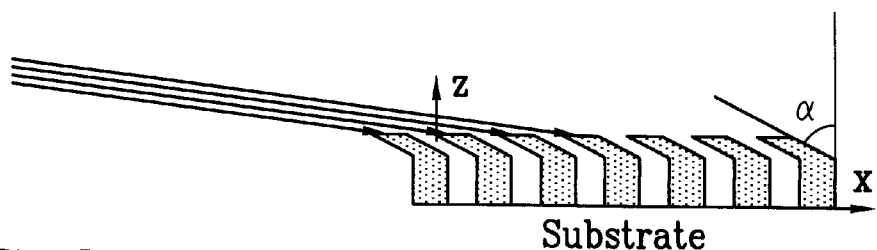

GLAD is based on thin film deposition, by evaporation or sputtering, and employs oblique angle deposition flux and substrate motion to allow nanometer scale control of structure in engineered materials. The substrate is oriented at a large oblique angle relative to the incident vapor flux. This leads to an effect called atomic shadowing and results in a porous structure with isolated columns of material growing toward the vapor source. This is described in FIG. 2. Semiconductors, metals, metal oxides and fluorides can be used by GLAD. Examples of structures previously created by GLAD are shown in FIG. 1 and the following references: K. Robbie and J. Brett, J. *Vac. Sci. Technol. B* 15, 1460–1465 (1997) and K. Robbie, J. C. Sit and J. Brett, *J. Vac. Sci. Technol. B*, 16,1115–1122 (1998). The spiral lattice structures micro-fabricated by GLAD can be further modified to conform to the requirements of the present invention. These modifications include (i) mechanical compression of spirals along their z-axis in order to modify the lattice parameters c and L describing the vertical and horizontal extent (projection) of the spiral arms, (ii) further deposition of solid material on the surface of the spiral posts (post treatment) by a non-GLAD method to modify the structural parameter r describing the cross-sectional radius of the spiral arm, and (iii) infiltration of the entire void region between spiral posts with a different material than that of said posts for the purpose of selective chemical etching of the said post and the fabrication of an "inverse" spiral photonic crystal. The PBG blueprint described in the present invention provides specific instructions whereby the GLAD method together with said modifications can be readily utilized to create PBG materials with large three-dimensional gaps. The microstructures built using GLAD can be used either as PBG materials or serve as templates for growing PBG materials from an even larger range of materials. Alternatively, 2-photon lithography can be used to create a template for a PBG material. In this approach a two-photon microscope focuses light in a suitably prepared liquid which causes polymerization (solidification) wherever the microscope focuses [see Cumpston et. al. *Nature* 398 51–54 (1999)]. The focus can be moved by computer control to "write" the square spiral post structure. The solid polymer template can then be inverted to create the PBG material.

The Structure of the Crystal

Figure 4:
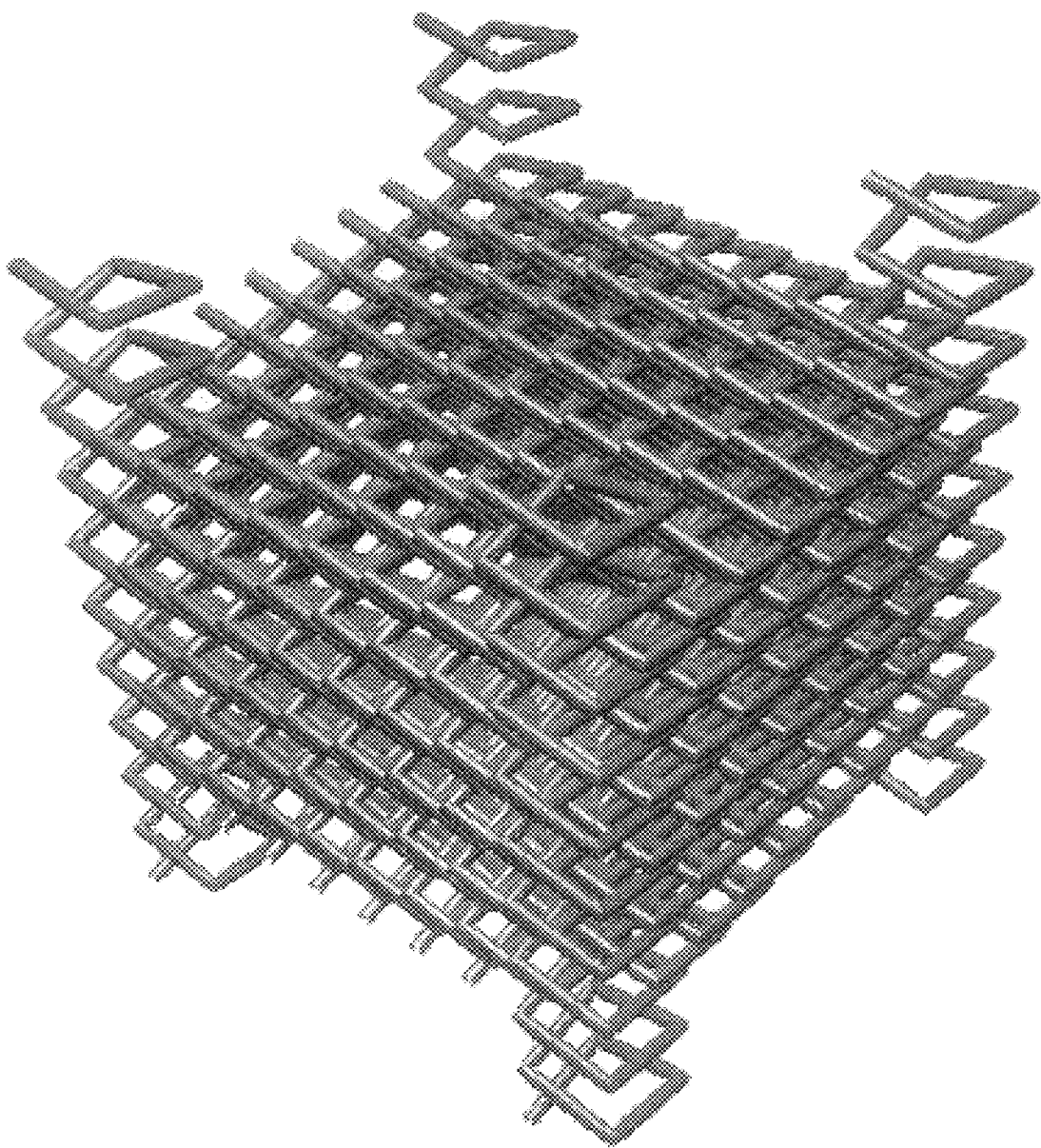
FIG. 4 shows a perspective view of a portion of a (1,0,0)-diamond-GLAD-5 photonic crystal constructed according to the present invention. The photonic crystal is built with spirals which have circular cmss section arms. In order to make the image clearer the spirals at the corners of the crystal are hIghlighted with a different color and length. All the spirals have the same geometry.

The present invention, in one embodiment, provides a photonic crystal whose structure is depicted in FIG. 4, which is a perspective view of a portion of a "square spirals" photonic crystal labeled as (1,0,0)-diamond-GLAD-5. The geometry of the building blocks of the crystal is described in FIG. 5. The underlying lattice of the crystal is tetragonal with lattice constant c along the z axis and a along x and y axes. In the description below we choose to express all the lengths in terms of a. FIG. 5a is a perspective view of a building block of the square spiral photonic crystal of FIG. 4, a photonic crystal building block. The tetragonal lattice is characterized by lengths a and c. The geometry of the square spiral is characterized by its width, L, pitch c and radius r. For clarity a single spiral is shown coiling around in 4 unit cells.

The building block of the crystal is the square spiral coil of pitch c (see the side view of FIG. 5b) with a single loop whose transverse cross section is a square with edge of length L (see the top view in FIG. 5c). The pitch is the same as the lattice constant in the z direction and the coil is wrapped around the z axis. Each of the segments of the coil is coated with a cylinder of radius r (see FIG. 5c) whose dielectric constant is denoted by $\epsilon$. The spirals are embedded in a material whose index of refraction is $\epsilon$. In studies of the parameter space no restriction is imposed on the size of L relative to a and we allow for overlap between adjacent spirals.

For the theoretical modeling of the electromagnetic properties of the photonic crystal we use a value of 11.9 for the dielectric constant of the material with high index of refraction. This approximates very well Si at wavelengths around 2 microns (see Edward D. Palik, *Handbook of Optical Constants of Solids, Academic Press Inc.*, Orlando, 1985). The direct structure crystal is defined by $\epsilon=1$, $\epsilon=11.9$ and the inverted structure crystal is defined by $\epsilon=11.9$, $\epsilon=1$. In our analysis we choose to treat those spiral photonic crystals (which we refer to as GLAD structures) that do not involve a phase shift between adjacent spiral posts. By way of illustration (and in contrast to the present invention), various (non-GLAD) spiral photonic crystals can be visualized by simply taking an arbitrary spiral post, with pitch c that coincides in length with the side length of a given cube, and creating a crystal by translating said spiral post by the set of all lattice vectors of the face centered cubic or body centered cubic lattices based on said cube. Replicating said spiral post at each of the lattice points of said 3-d lattices would require a c/2 translation along the z axis between adjacent spirals. Such a phase shift cannot be controlled by the GLAD technique as it stands today.

In *Phys. Rev. B*, 57, 2006–2008 (1998) the authors study photonic crystals built from circular spiral elements on simple cubic (SC), face centered cubic (FCC) and body centered cubic (BCC) lattices. Each of these (prior art) photonic crystals is distinct from the classes of spiral photonic crystals described in the present invention. The FCC and BCC photonic crystals in said prior art are non-GLAD structures and the photonic crystals of said prior art do not involve polygonal spirals. It is reported in said prior art that in the case of a crystal made from a material with a dielectric constant of 12.25 (the spirals) in air the maximum band gap is only 3% and it appears when the simple cubic lattice is deformed into a tetragonal lattice. In the present invention, both the structure of the spirals (primarily square in our study), the fact that they are related to (but not co-incident with) bonding arms of either the FCC, diamond, or distorted diamond (DD) lattices, and the fact that they overlap contribute to the significant enhancement of the size of the full photonic band gap.

In the theoretical calculations we have used the plane waves expansion method (see *Phys. Rev. Lett.*, 65, 3152–3155 (1990)) for calculating the photonic band structure of the crystal. For all of the calculations we have used an expansion with more than 1400 plane waves. The Fourier coefficients of the dielectric have been calculated using the Fast Fourier Transform method with a sampling of at least $512^3$ points in one unit cell. The theoretical calculations for both the direct and inverted structures, techniques for microfabrication, and application of these structures to optical micro-circuitry are presented in the following fourteen examples.

EXAMPLES

Example 1

Direct Structure of Square Spiral Posts: (1,0,0)-diamond GLAD-5

The direct structure photonic crystal (1,0,0)-diamond GLAD-5 is characterized by $\epsilon=11.9$ and $\epsilon=1$ and all the geometrical parameters described with respect to FIG. 5. In this case we find a local maximum of the relative band gap as a function of L, c and r for the combination [L,c,r]=[1.65, 1.3,0.13]. All these parameters are measured in units of a, the lattice constant. The volume filling factor of the spirals, $f_{spir}$, serves as a measure of the degree with which the spirals form a connected or disconnected structure. At small $f_{spir}$ the individual spirals are disconnected and the air forms the connected component in the system whereas for large $f_{spir}$ both the air and spirals form connected components. The calculations show that a sizable full photonic bad gap exists for a wide range of spirals filling factor.

Figure 6:
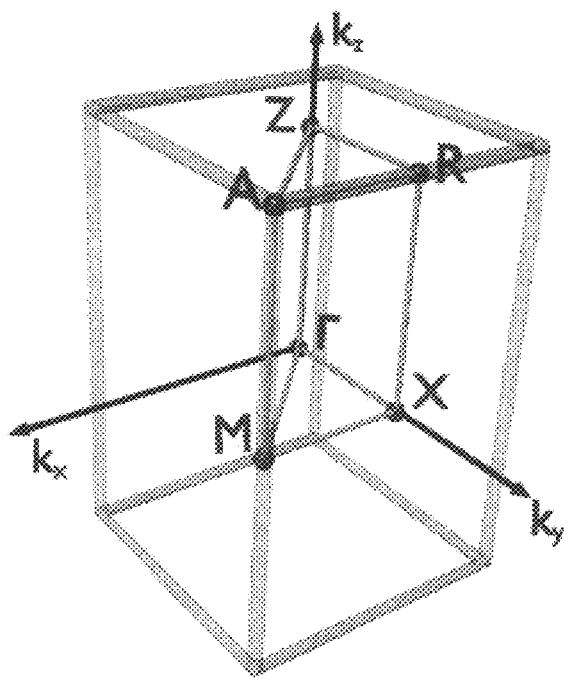
FIG. 6 shows the position of the high symmetry points in the Brillouin zone of a tetragonal lattice.
Figure 7:
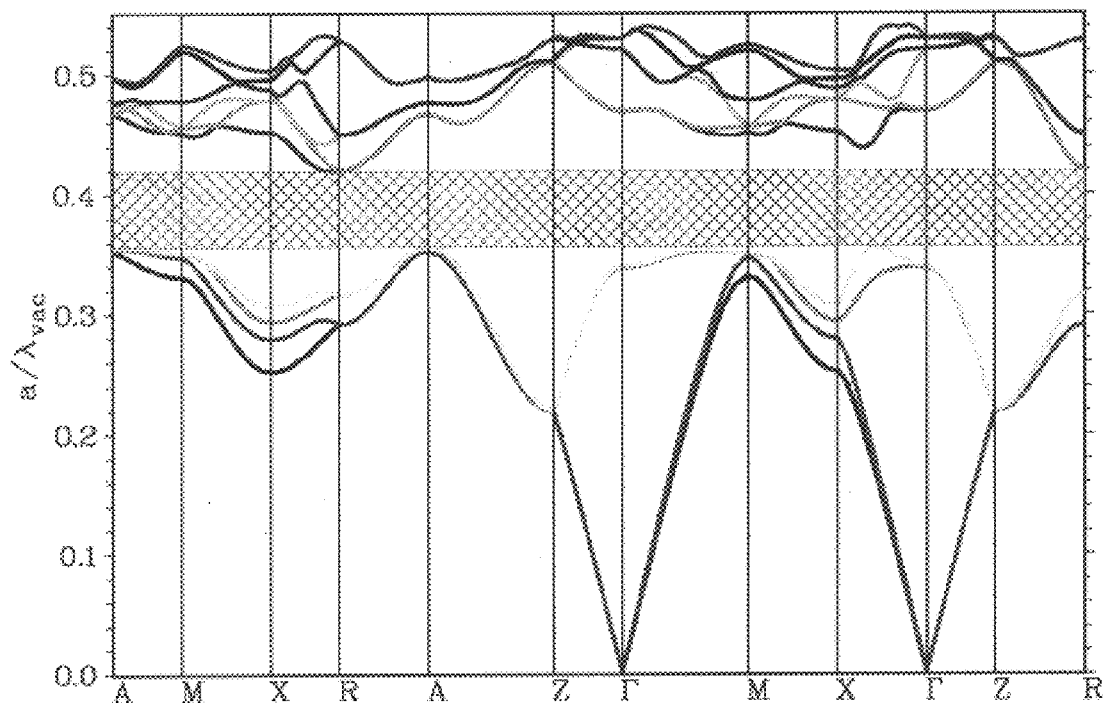
FIG. 7 shows the photonic band structure for the direct structure of the optimized square spiral crystal (1,0,0)-diamond-GLAD-5 characterized by [L,c,r]=[1.65,1.3,0.13] This choice yields the largest PBG for this specific "island". The lengths are given in units of a, the lattice constant (distance between the centers of nearest neighbor seed posts on the substrate). The relative width of the photonic band gap is 16.2% and is centered at a wavelength $\lambda_0$ given by $a/\lambda_0$=0.39. The position of the high symmetry points is shown in FIG. 6.

FIG. 6 shows the positions of the high symmetry points in the Brillouin zone and FIG. 7 shows the photonic band structure for the direct structure crystal with the optimized parameters. A large photonic band gap of relative width 16.2% opens between $4^{th}$ and $5^{th}$ bands. The upper edge of the photonic band gap closes at R point and only two bands, $5^{th}$ and $6^{th}$, contribute to the spectrum around the upper edge, thus a large pseudo-gap is expected in this spectral region.

Figure 8:
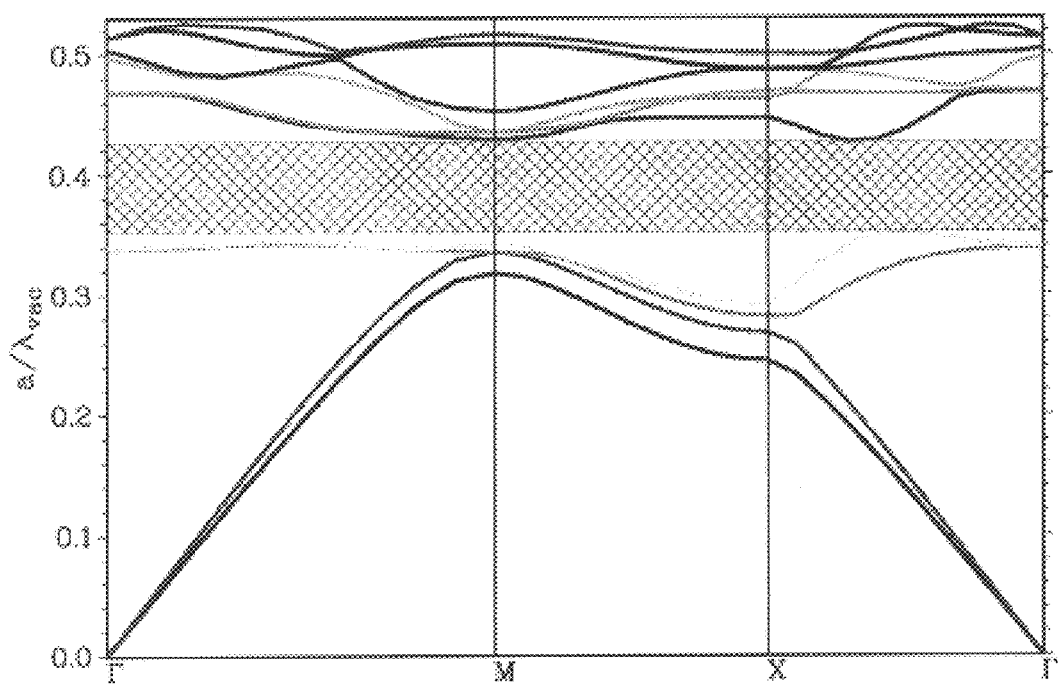
FIG. 8 shows the 2D band structure for the direct structure crystal (1,0,0)-diamond-GLAD-5 characterized by [L,c,r]= [1.6,1.2,0.14] obtained by restricting the Bloch vector to the x-y plane. The lengths are given in units of a, the lattice constant. The relative width of the photonic band gap is 19.4%. The positions of high symmetry points are illustrated In FIG. 6.

Thin films of this square spiral structure can also be used as a 2-d photonic crystal. The corresponding 2-d band structure for such a crystal can be obtained by restricting the Bloch vector only to the xy plane. FIG. 8 shows the 2-d band structure for the direct structure characterized by [L,c,r]= [1.6,1.2,0.14]. The relative size of the band gap in this case is 19.4% and is close to the optimum value of 21.1% obtained for [L,c,r]=[1.6,1.4,0.16].

Figure 9:
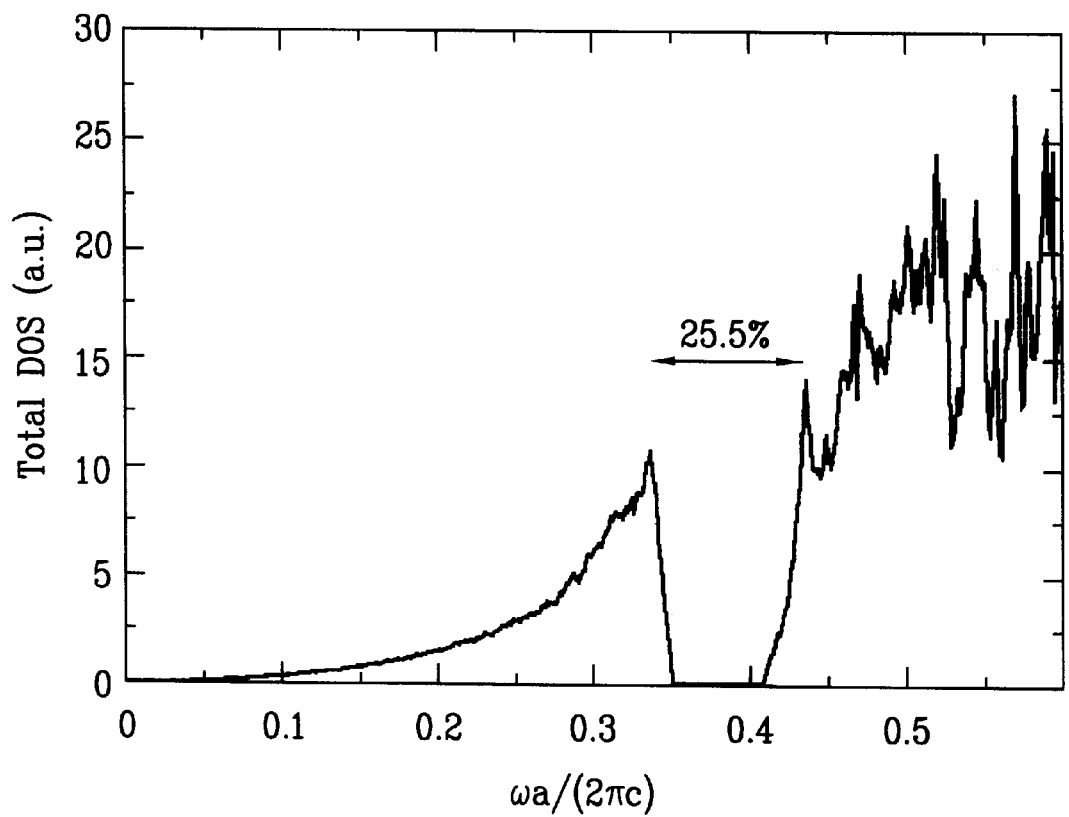
FIG. 9 shows a plot of the total density of states for the direct structure (1,0,0)-diamond-GLAD-5 crystal characterized by [L,c,r]=[1.6,1.2,0.14] where the lengths are given in units of a, the lattice constant. The density of states is measured in arbitrary units.

FIG. 9 shows the total density of states for the direct structure crystal characterized by [L,c,r]=[1.6,1.2,0.14]. In the calculation we used the improved tetrahedron method [see Phys. Rev. B, 49, 16223–16233 (1994)] adapted to the photonic case. The large pseudo-gap around the full band gap has a relative width of 25.5%.

Figure 10:
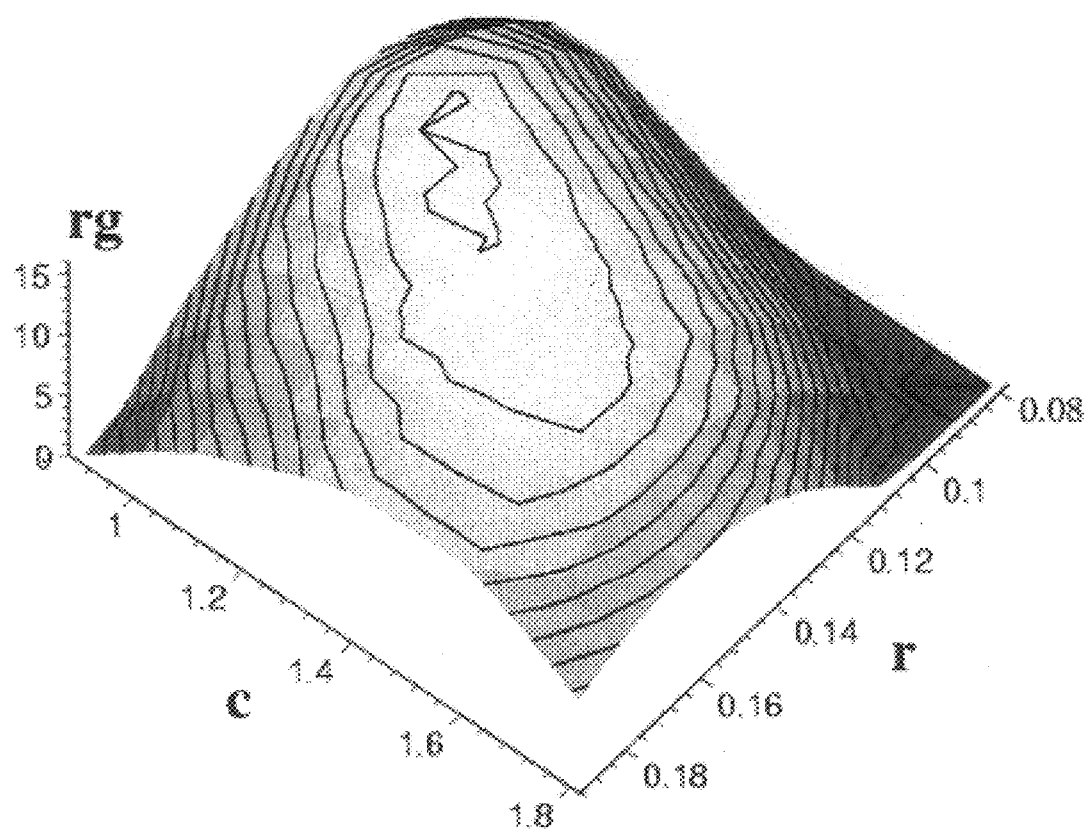
FIG. 10 shows the relative size of the full PBG 9 rg, measured in %) for the direct structural crystal (1,0,0)-diamond-GLAD-5 as a function of r and c for L=1.6. Constant value contours are also sketched on the plot for all the integer values from 1 to 15.
Figure 11:
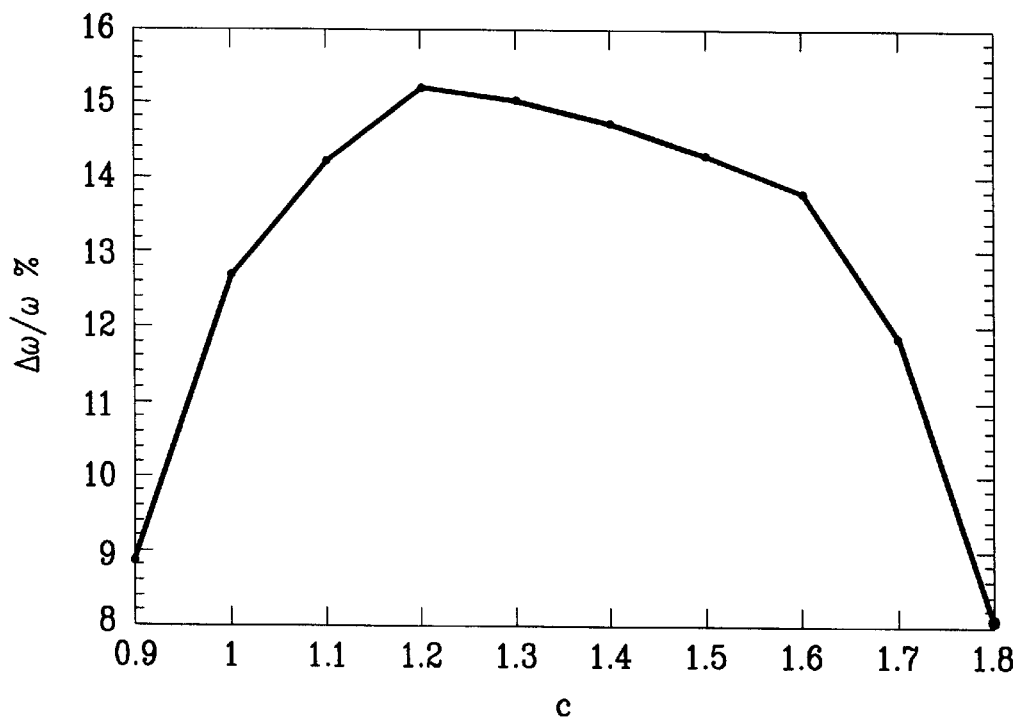
FIG. 11 shows the relative size of the full PBG for the direct structural crystal (1,0,0)-diamond-GLAD-5 as a function of c for L=1.6, r=0.14.
Figure 12:
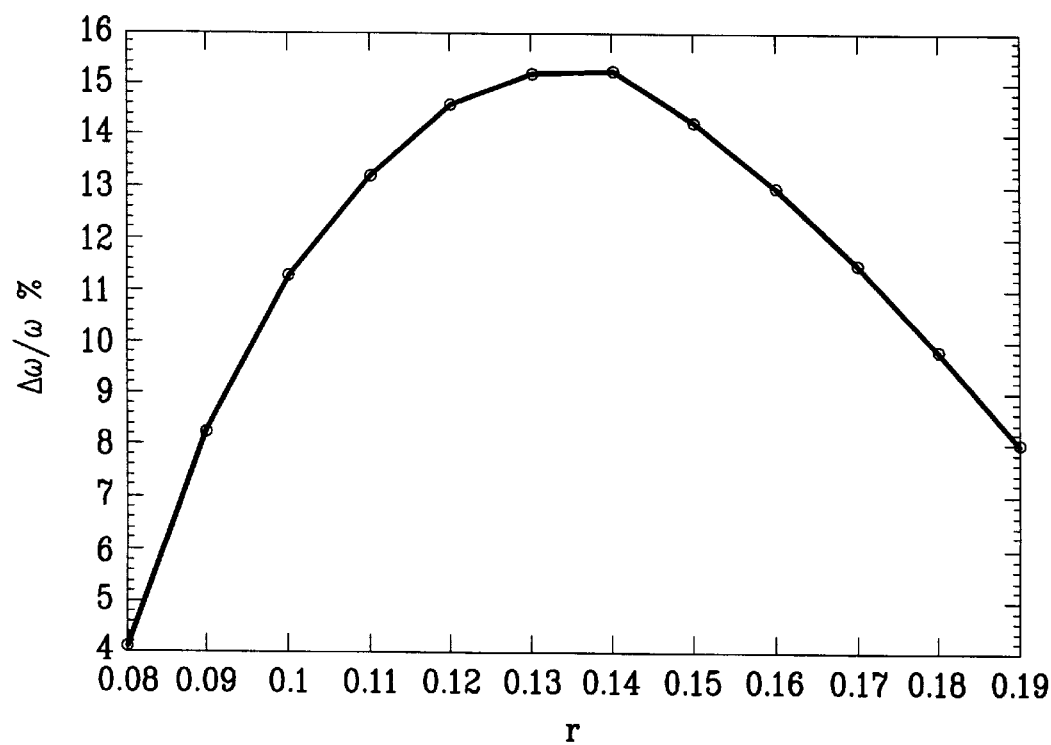
FIG. 12 shows the relative size of the full PBG for the direct structural crystal (1,0,0)-diamond-GLAD-5 as a function of r for L=1.6, c=1.2.

FIG. 10 shows a contour plot displaying the relative width of the full gap as a function of r and c for a fixed L=1.6 for the direct structure crystal. It is found that the variation of the size of the gap with the geometry of the spirals is relatively slow in the region around the maximum. Constant value contours are shown on the plot to better illustrate this point. The filling fraction of the spiral component varies from 14% to 40% over the range of parameters shown in the plot. FIG. 11 and FIG. 12 show respectively the r=0.14 and c=1.2 sections of FIG. 10.

Figure 13:
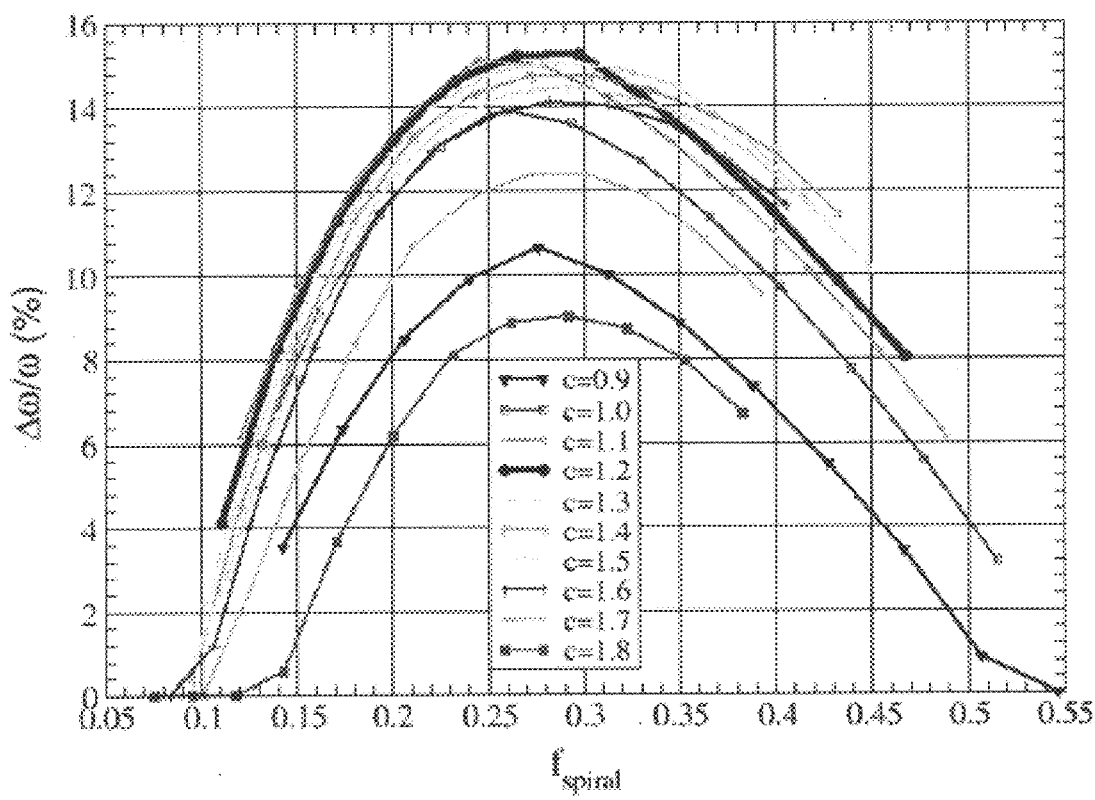
FIG. 13 shows the redative size of the full PBG for the direct structural crystal (1.0.0)-diamond-GLAD-5 as a function of the spirals volume filling fraction, $f_{spir}$ for L=1.6. Different curves correspond to different values for c.

FIG. 13 shows the relative size of the gap as a function of the spirals filling fraction for L=1.6 and various values of c. When L and c are fixed, the spirals filling fraction is a function of r only. The curves show that the optimum $f_{spir}$ is around 25%.

Figure 14:
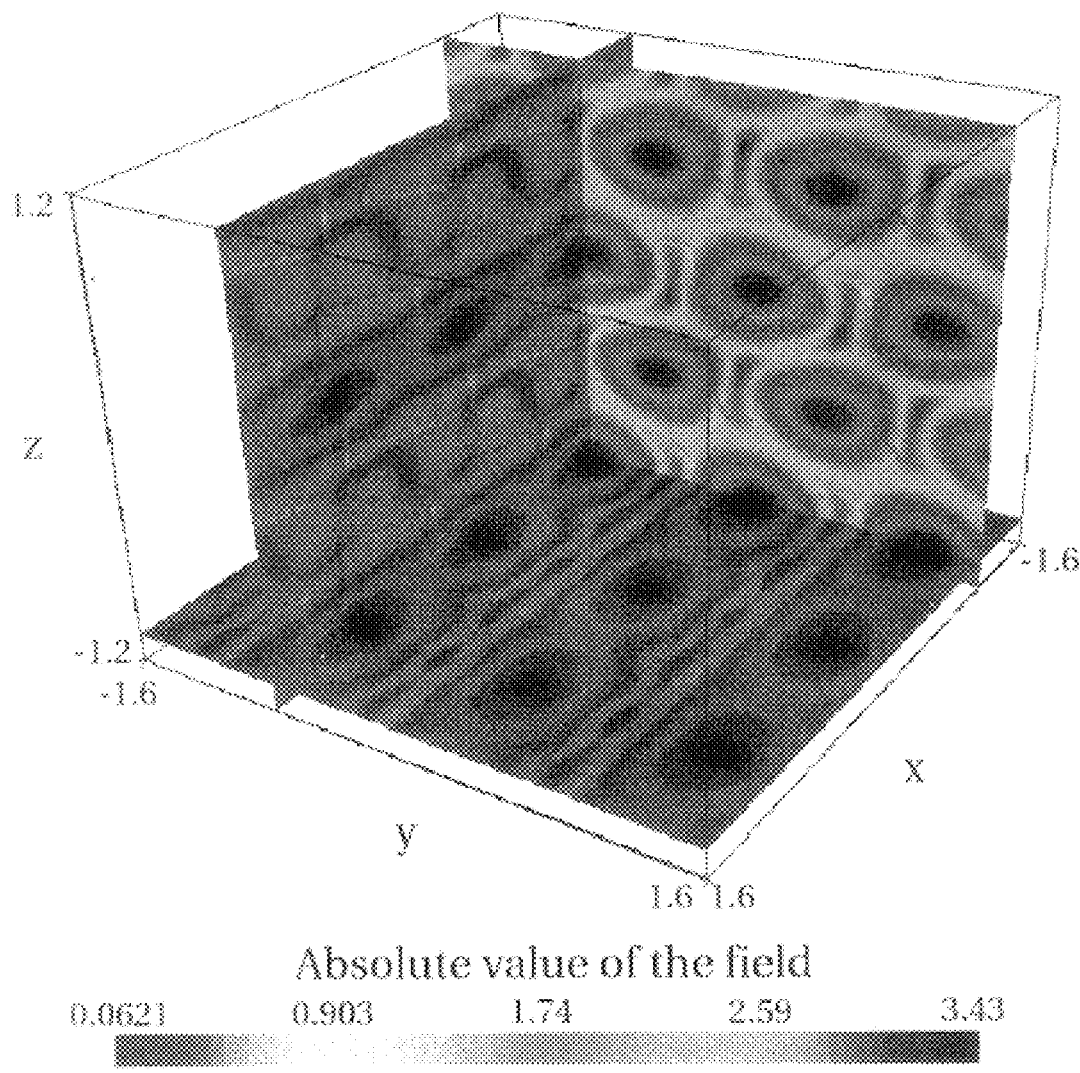
FIG. 14 shows the absolute value of the electric field in photonic crystal (1,0,0)-diamond-GLAD-5 for the mode corresponding to the 5$^{th}$ band at R point (see FIG. 7). The absolute value of the E field is color coded according to the color bar. The dielectric constant is represented by the relief of the slice plane. The deformation of the slice plane is proportional to the dielectric constant with 0 deformation where the dielectric constant is minimum. The crystal is described in the caption of FIG. 7.

The spatial distribution of the electromagnetic field in the photonic crystals is also of great interest. The ability to alter the coupling between the matter and radiation field in the photonic crystal is influenced dramatically by the electric field at the specific location [see Phys. Rev. E., 58, 3896–3908 (1998)]. In FIG. 14 we show the spatial distribution of the absolute value of the electric field for the mode corresponding to the $5^{th}$ band at the R point. The region sampled contains a few units cells (the unit of length is again a). The figure shows three slices each perpendicular to the x, y and z axes. The electric field is calculated on each of the three slices and its absolute value is used as the color function (see the color bar). The dielectric constant is sampled as well on the same planes and its value is used to warp (deform) linearly the surface of the slice. The deformation is 0 where the dielectric constant is minimum (air in this case) and has an arbitrary value in the high dielectric component (spirals in this case). The deformation of the plane perpendicular to the x axis is in the positive x direction and similarly for the planes perpendicular to y and z axes.

Example 2

Spiral Photonic Crystal Templates consisting of $SiO_2$ (Glass)

Figure 15:
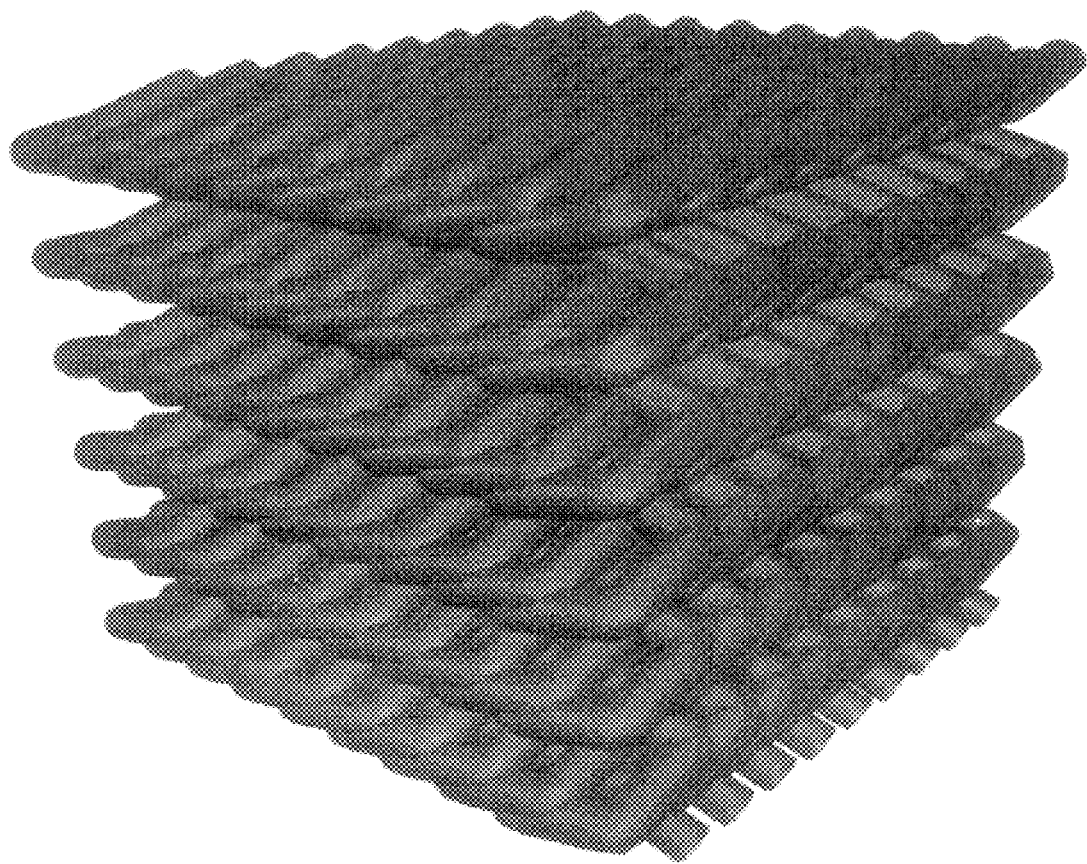
FIG. 15 shows the template which can be used to obtain the optimized Inverse (1,0,0)-diamond GLAD-5 structure. Depicted is a spiral photonic crystal template consisting of $SiO_2$ (glass) spiral arms used to micro-fabricate the Inverse (1,0,0)-diamond-GLAD-5 photonic band gap material. After the initial glass template is grown by GLAD, the template is heat treated to achieve smoothness of the surfaces. The template is then compressed by applying mechanical pressure in the vertical direction allowing the angle which the spiral arm makes with respect to the vertical z-axis to exceed the limit currently achievable by GLAD. The cross-section arm thickness is increased through a sol-gel process which deposits additional $SiO_2$ on all exposed surfaces and which is achieved by placing the template in an appropriate solution. As shown in the figure, the interleaving spiral arms overlap. This template is then placed in a chemical vapor deposition chamber to allow infiltration by a semiconductor such as silicon, germanium, GaAs, InP, or combinations these and semiconductors. A selective chemical etch is used in the final step to remove the original glass template.

A considerably larger three-dimensional photonic band gap can be realized by "inversion" of the structure described in Example 1. By way of illustration, glancing angle deposition of $SiO_2$ (glass) on seed posts whose geometrical positions are described in Example 1 is used to microfabricate a "template" photonic crystal consisting of glass spiral posts in a lattice. Said "template" may then be heat "treated" to smooth the surfaces of the spiral arms. A further "treatment" of the template can be performed to expand the radius of the spiral arms to a predetermined radius by placing said template into a solution and by a sol-gel process or Stober method (W. Stober, A. Fink, E. Bohn, J. *Colloid. Interface Sci.*, 26, 62 (1968)), depositing additional $SiO_2$ onto exposed surfaces of the spiral arms. Through this process, the interleaving spiral arms may touch or overlap one another (see FIG. 15).

The GLAD process together with said "treatment" steps provides a template for "inversion" of the structure for the synthesis of PBG materials such as Inverse (1,0,0)-diamond-GLAD-5 described in Example 3 below. This is achieved by subjecting the completed template, for instance, to chemical vapor deposition by semiconductors such as silicon, germanium, GaAs, InP, any other appropriate semiconductor whose refractive index exceeds 2.0, or a combination of said semiconductors, such that said semiconductors completely fill the void regions between the spiral arms of the template. After this infiltration is completed, the sample is selectively etched by hydrofluoric acid (or other means) to remove the original template and replace the spiral arms with air. The remaining (un-etched) semiconductor forms the backbone of a PBG material such as Inverse (1,0,0)-Diamond-GLAD-5.

Example 3

Inverse Structure of Square Spiral Posts: Inverse (1,0,0)-diamond-GLAD-5

Figure 16:
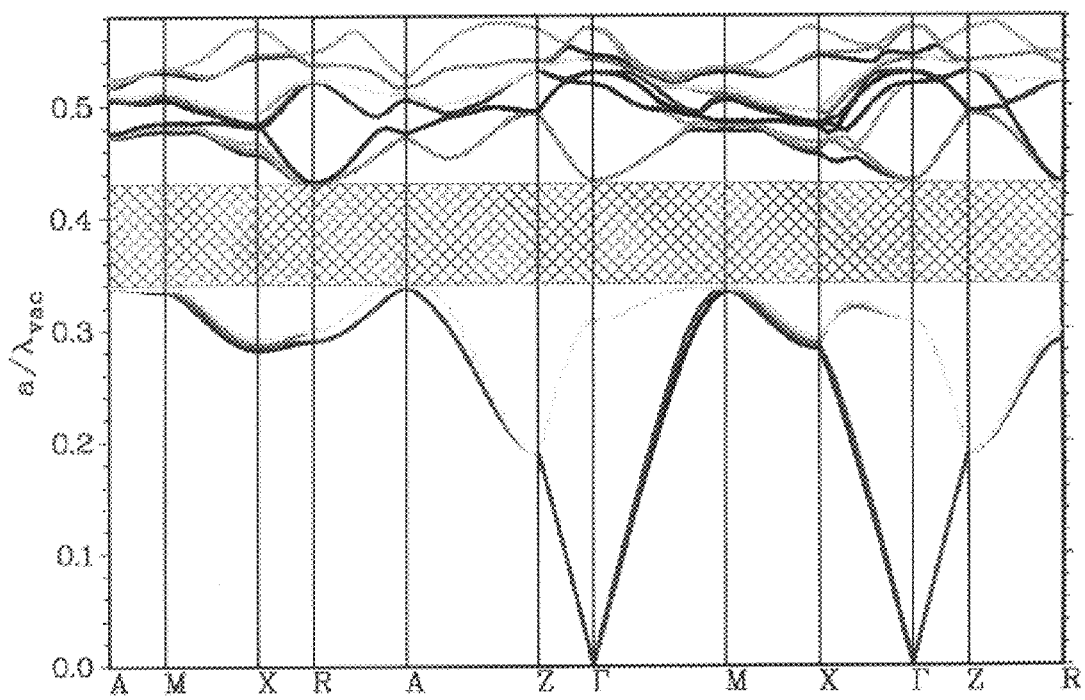
FIG. 16 shows the band structure for the inverse (1,0,0)-diamond-GLAD-5 optimized crystal characterized by [L,c,r]=[1.5,1.7,0.33] where the lengths are given in units of a, the lattice constant. The relative width of the photonic band gap is 23.8% and is centered at a wavelength $\lambda_0$ given by $a/\lambda_0$ =0.39. The positions of high symmetry points are illustrated in FIG. 6.

Calculations similar those described in Example 1 have been performed for the inverted structure crystal Inverse (1,0,0)-diamond-GLAD-5, characterized by $\epsilon=11.9$ and $\epsilon=1$. In this case we find a local maximum of the relative band gap as a function of L, c and r located at [L,c,r]=[1.5,1.7,0.33]. In FIG. 16 we show the photonic band structure of the inverse structure crystal with the optimized parameters. A large photonic band gap of relative width 23.6% opens between $4^{th}$ and $5^{th}$ bands.

Figure 28:
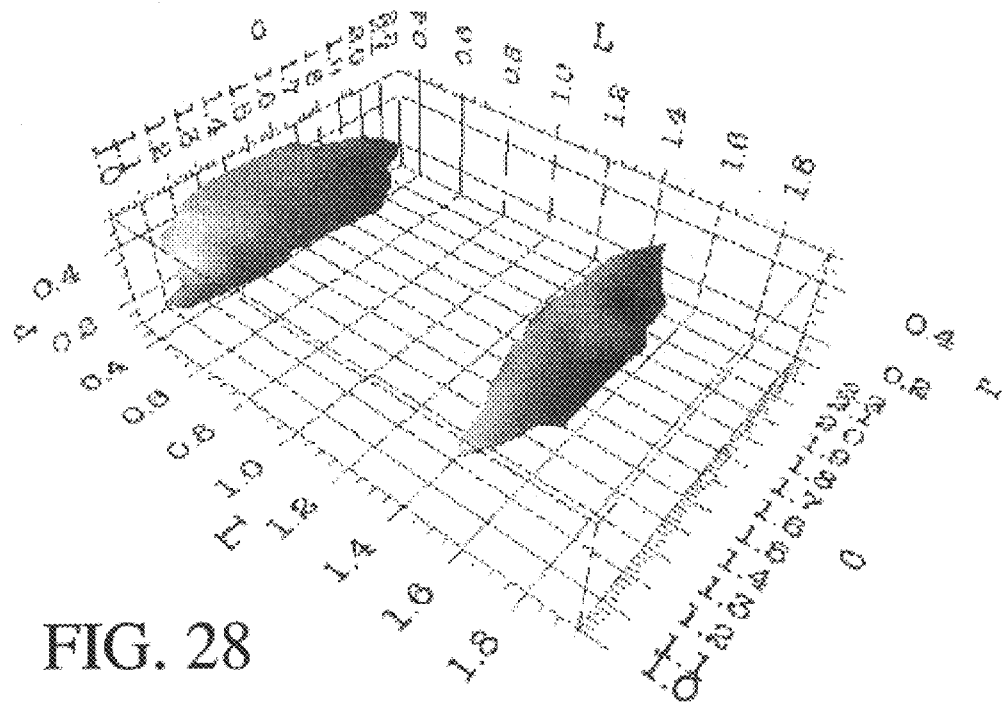
FIG. 28 shows a 3-d map of the full PBG for an inverse (1,0,0) diamond GLAD-1 and GLAD-5 crystal made from square spiral arms with a circular cross section. Isosurface plot of the gap size as a function of L, c and r. The isosurface corresponds to a gap size of 10%. The gap is larger than 10% inside the two "islands".

FIG. 28 shows an inverse (1,0,0)-dlamond-GLAD-1 and inverse (1,0,0)-diamond-GLAD-5 islands square spiral arms with circular cross section. Isosurface plot of the gap size as a function of L,c and r. The isosurface corresponds to a gap size of 10%. The gap is larger than 10% inside the two "islands".

Figure 17:
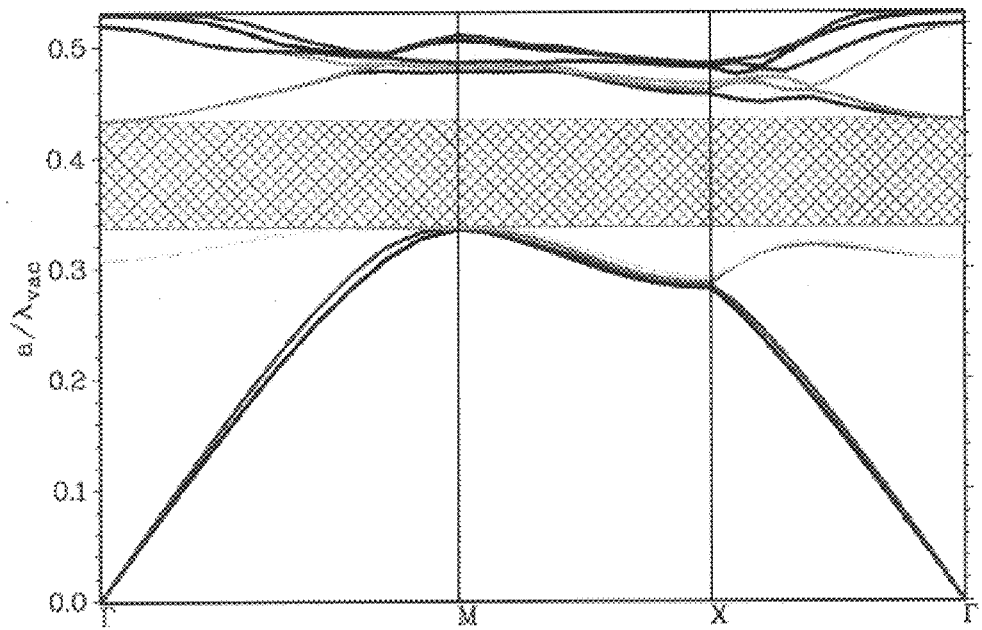
FIG. 17 shows the 2D band structure for the inverse optimized (1,0,0)-diamond-GLAD-5 crystal characterized by [L,c,r]=[1.5,1.7,0.33]. The lengths are given in units of a, the lattice constant. The relative width of the photonic band gap is 25%. The positions of high symmetry points are illustrated in FIG. 6.

The corresponding 2-d band structure for the inverse crystal can be obtained by restricting the Bloch vector only to the xy plane. FIG. 17 shows the 2-d band structure for the inverse structure with the same parameters as the ones used for generating the data for FIG. 16. The relative size of the band gap in this case is 25%. The optimum value for the 2-d gap size of the inverse structure is 28.1% and is obtained for [L,c,r]=[1.5,1.6,0.32].

Figure 18:
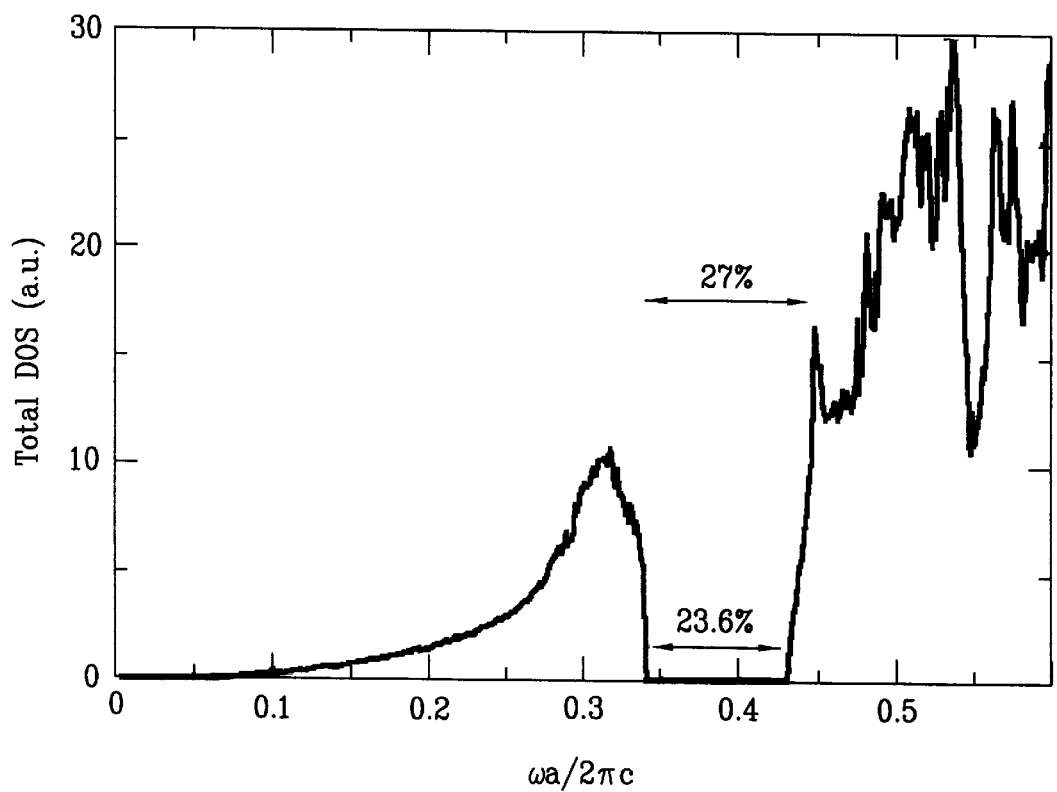
FIG. 18 is a plot of the total density of states for the inverse (1,0,0)-diamond-GLAD-5 optimized crystal characterized by [L,c,r]=[1.5,1.7,0.33]. The lengths are given in units of a, the lattice constant. The density of states is measured in arbitrary units.

FIG. 18 shows the total density of states for the inverse structure crystal whose band structure is shown in FIG. 16. It is worth mentioning the fact that in the case of the inverted structure the size of full photonic band gap is very close to the size of the pseudo-gap. The fact that both the lower and upper edges of the full photonic band gap close at two symmetry points (lower edge at A and M points and the upper edge at Γ and R) explains this optimal full photonic band gap.

Figure 19:
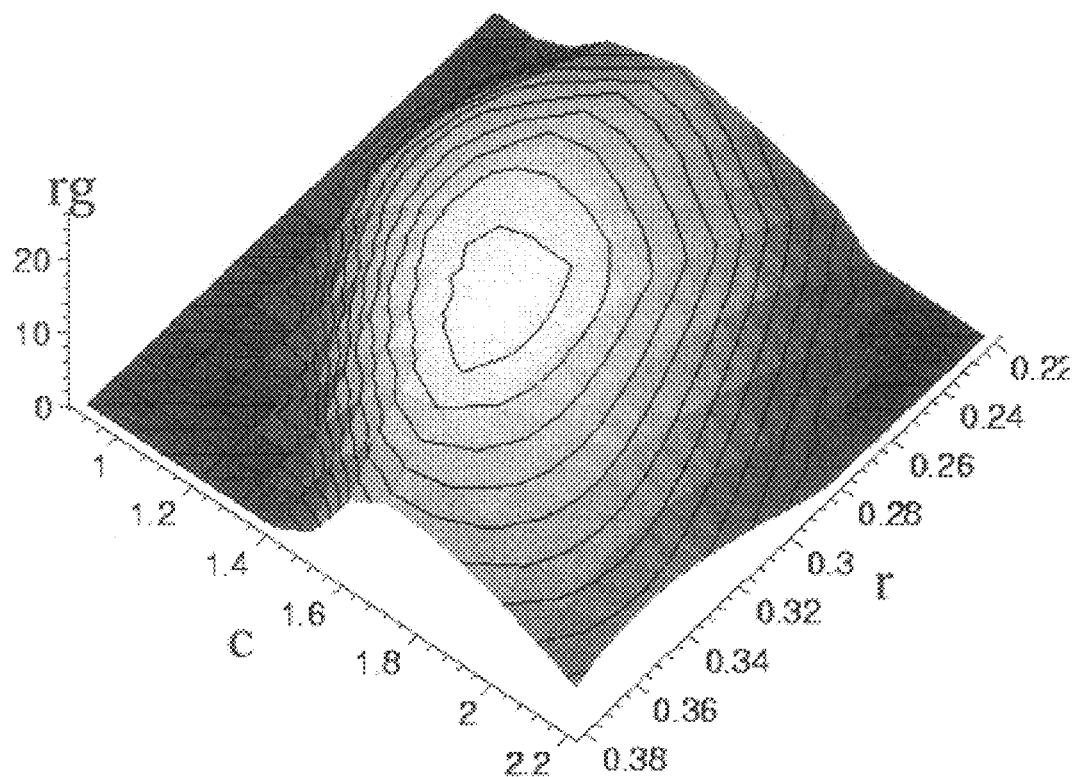
FIG. 19 shows the relative size of the full PBG, rg (measured in %) for the inverse (1,0,0)-diamond-GLAD-5 photonic crystal as a function of r and c at L=1.5. The lengths are given in units of a, the lattice constant. Constant value contours are also sketched on the plot. The maximum value of the relative band gap is 23.6%.
Figure 20:
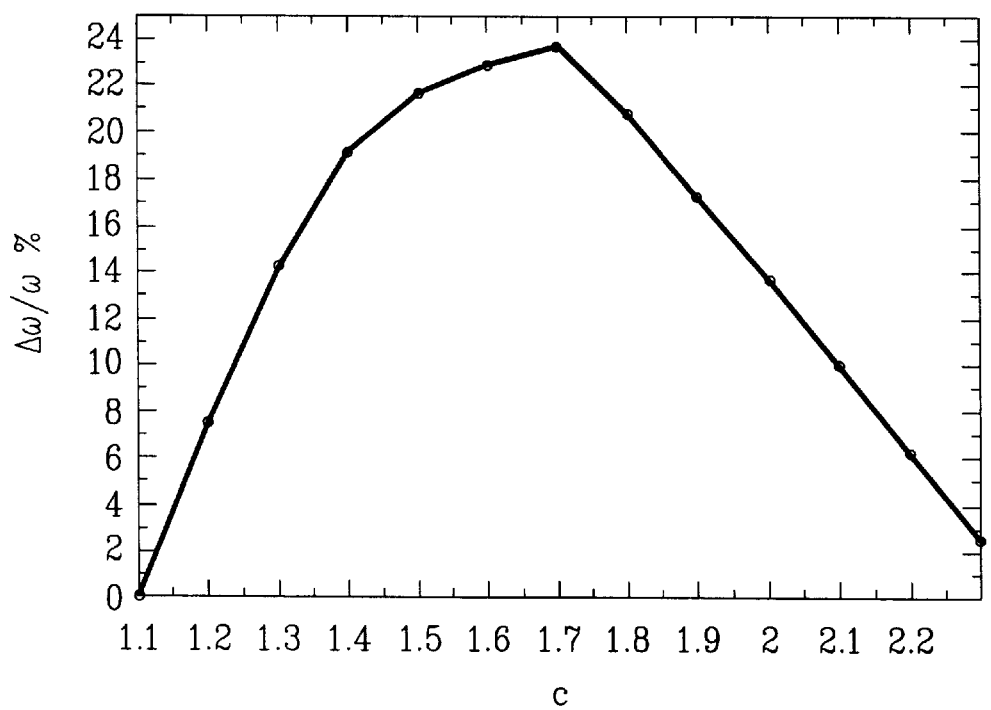
FIG. 20 shows the relative size of the full PBG for the inverse (1,0,0)-diamond-GLAD-5 as a function of c for L=1.5,r=0.33. The lengths are given in units of a, the lattice constant.
Figure 21:
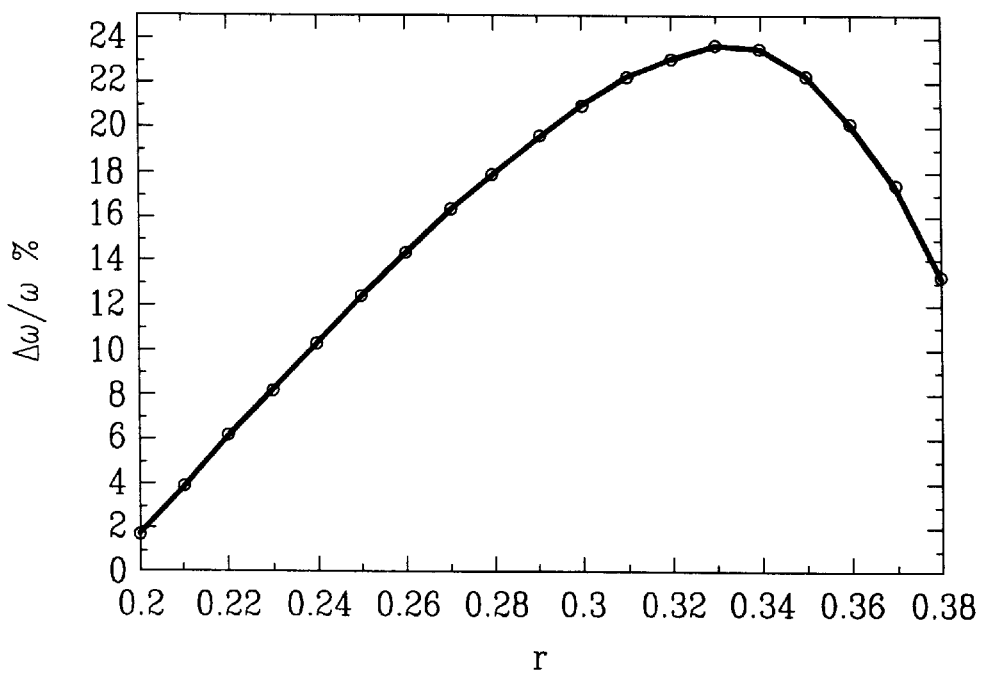
FIG. 21 shows the relative size of the full PBG for the inverse (1,0,0)-diamond-GLAD-5 as a function of r for L=1.5, c=1.7. The lengths are given in units of a, the lattice constant.

FIG. 19 shows a contour plot displaying the relative width of the full gap of the inverse structure crystal as a function of r and c for a fixed L=1.5. The value of L was chosen to optimize the size of the gap. It is found that the variation of the gap with the geometry of the spirals is relatively slow in the region around the maximum. Constant value contours are shown on the plot to better illustrate this point. The filling fraction of the higher index of refraction component of the optimized crystal template is 20%. FIG. 20 shows the relative size of the full photonic bandgap as a function of c for L=1.5, r=0.33 for the inverse structure and FIG. 21 shows the relative size of the full photonic bandgap as a function of r for L=1.5, c=1.7 for the inverse structure.

Figure 22:
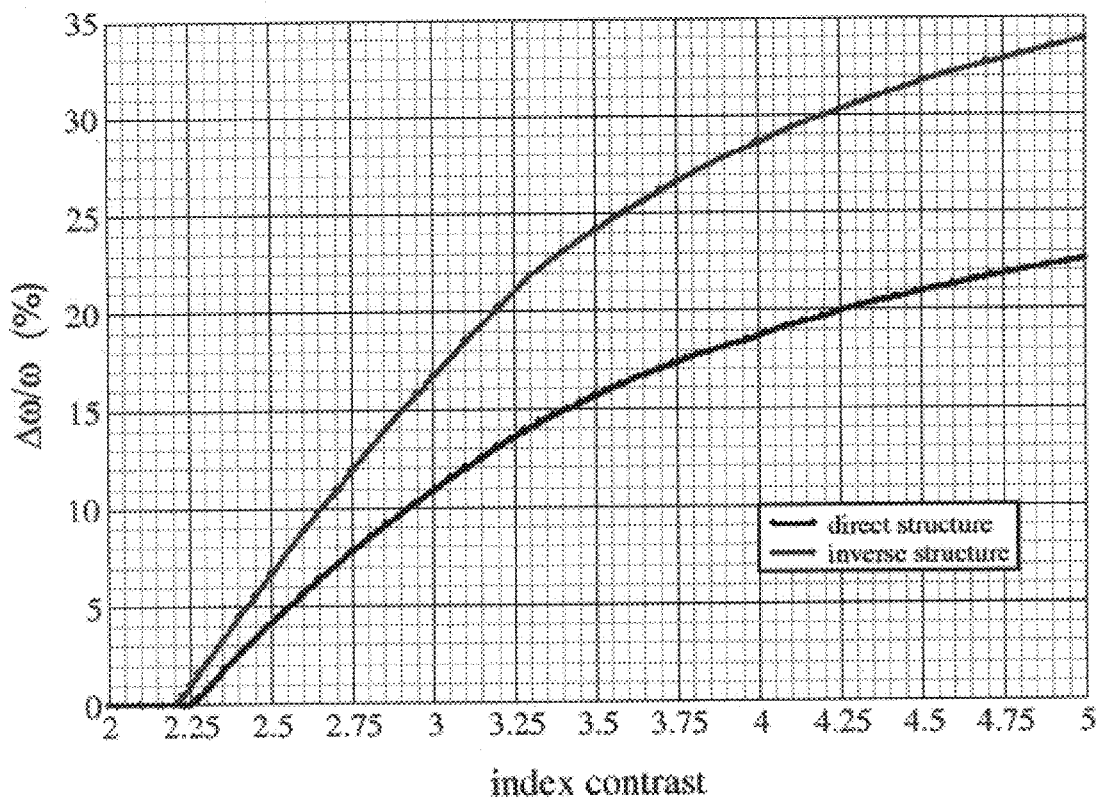
FIG. 22 shows the relative size of the full PBG for both the optimized direct and inverse (1,0,0) diamond GLAD-5 crystals as a function of the index contrast. The index contrast is defined as the ratio between the higher and lower indices of refraction.

FIG. 22 shows the relative size of the full photonic band gap as a function of the index contrast for both the direct and inverse structures. The index contrast is defined as the ratio between the high and low index components in the system.

Example 4

Direct Square Spiral Structure: (1,0,0)-Diamond-GLAD-1

Figure 23:
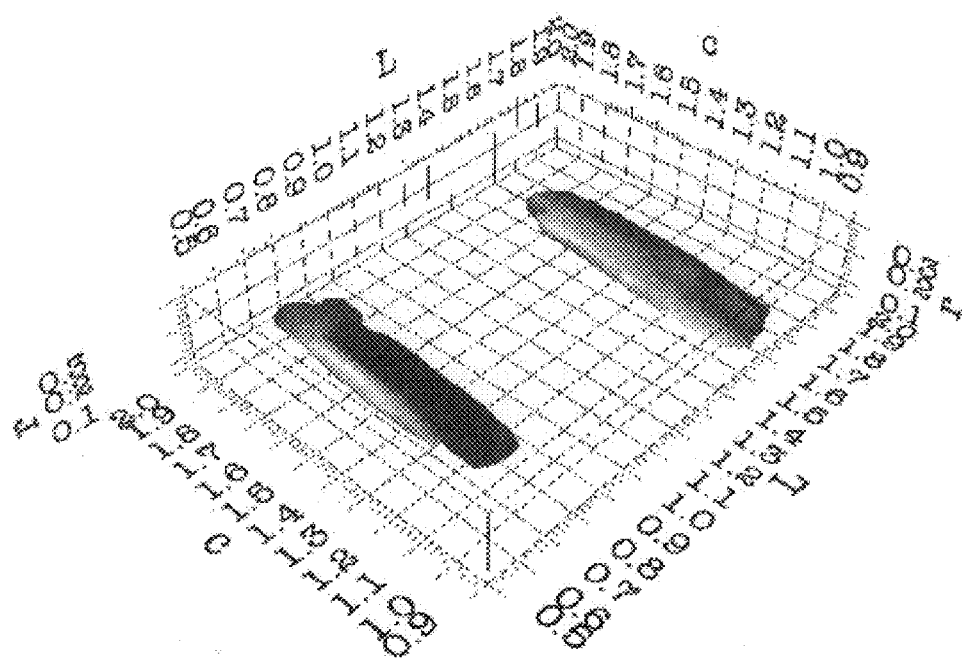
FIG. 23 shows a 3-d map of the full PBG for (1.0.0) diamond GLAD-1 and GLAD-5 crystals made from square spirals with circular crass section. Specifically, it shows "islands" in the parameter space (L,r,c) for the (1,0,0) diamond-GLAD1, square spiral photonic crystal (lower left shaded region) and the (1.0,0)-diamond-GLAD-5 square spiral photonic crystal (upper right shaded region). The shaded regions correspond to points in the parameter space where a complete 3-d PBG of at least 10% of the center frequency exists when the posts are made of silicon (or another material with the same refractive index as silicon). Here, the cross-section of the spiral arms is circular.
Figure 25:
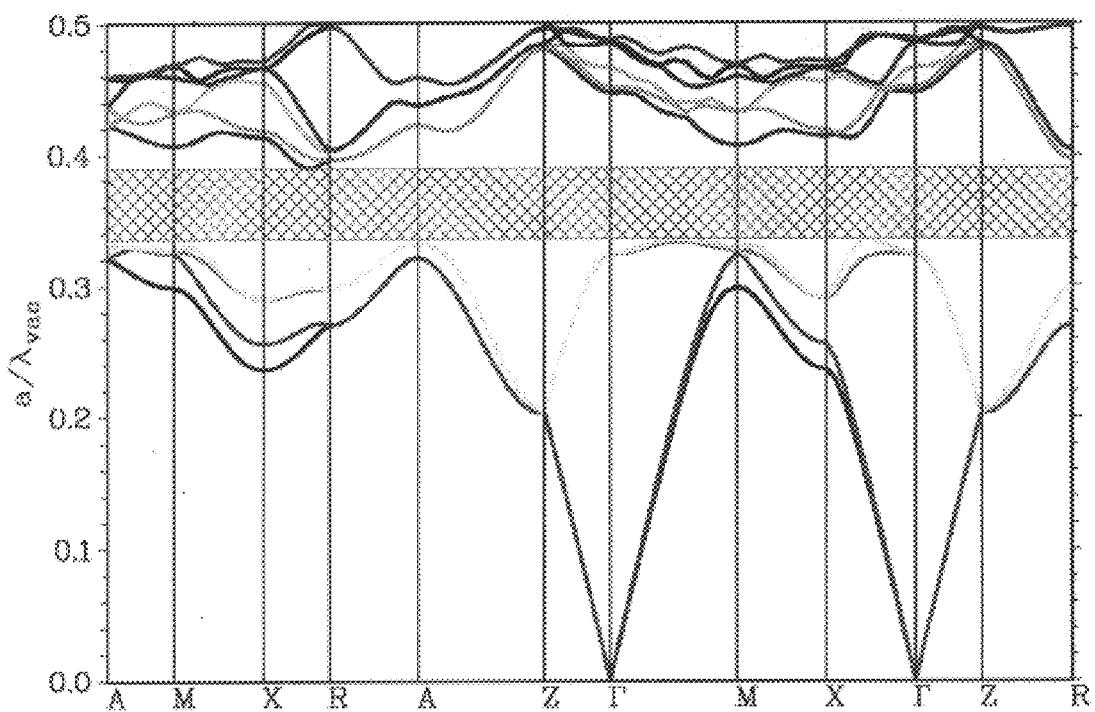
FIG. 25 shows the band structure for the optimized direct (1,0,0)-diamond-GLAD-1 crystal characterized by [L.c.r]= [0.7,1.35,0.2] where the unit of length is a, the tetragonal lattice constant. The relative width of the photonic band gap is 14.8% and is centered at a wavelength $\lambda_0$ given by $a/\lambda_0$=0.36. The position of the high symmetry points is shown in FIG. 6.

In analogy to Example 1, we identify an "island" of square spiral photonic band gap materials whose arm length, L, (projected onto the plane perpendicular to the z-axis) in the optimal case is less than the spacing between seed posts on the substrate. This island is depicted in FIG. 23 and does not require the interleaving of spiral posts that is present in Example 1. The largest PBG occurs (see FIG. 25) when [L,c,r]=[0.7,1.35,0.2] in units the seed post separation a and the corresponding 3-d photonic band gap spans 14.8% of the center frequency when the square spiral posts have a dielectric constant of 11.9, corresponding to silicon. The arms of this spiral structure are related (but not identical) to lines connecting the nearest neighbor points of a diamond lattice. Said square spiral PBG material belongs to the island (1,0,0)-diamond-GLAD-1.

Example 5

Inverse Square Spiral Structure: Inverse (1,0,0)-diamond-GLAD-1

Figure 24:
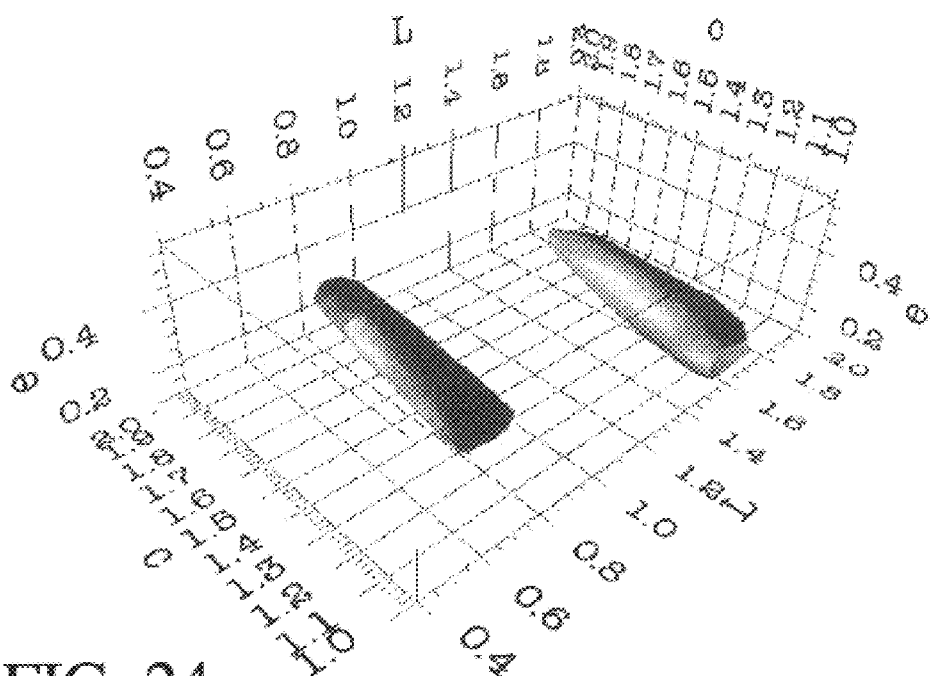
FIG. 24 shows a 3-d map of the full PBG for (1.0.0) diamond GLAD-1 and GLAD-5 crystals made from square spirals with square cross section. Specifically, it shows Islands in the parameter space (L,c,e) where e is the length of one side of the square cross sectiofi of the (1,0,0)-diamond-GLAD-1 and (1,0,0)-diamond-GLAD-5 square spiral photonic crystals. Shaded regions correspond to parameter choices where there is a complete 3-d PBG of at least 10% of the center frequency when the posts are made from silicon (or another material with the same refractive Index as silicon).
Figure 26:
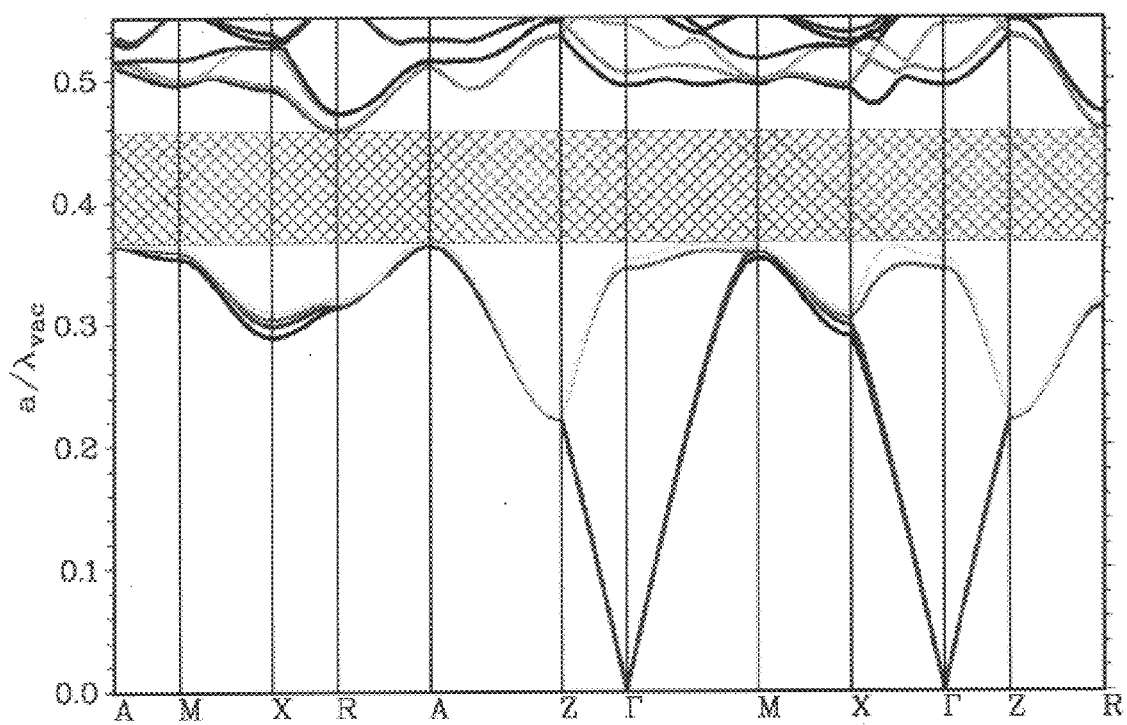
FIG. 26 shows the band structure for the optimized inverse (1.0,0) diamond-GLAD-1 crystal characterized by [L.c.r]=0.45,1.43,0.395] where the unit of length is a, the tetragonal lattice constant. The relative width of the photonic band gap is 22.3% and is centered at a wavelength $\lambda_0$ given by $a/\lambda_0$=0.41. The position of tue high symmetry points is shown in FIG. 6.

In analogy to example 3, we identify an "island" of Inverse square spiral photonic band gap materials whose arm length, L, (projected onto the plane perpendicular to the z-axis) in the optimal case is made of air and is less than the spacing between seed posts on the substrate. This island is depicted in FIG. 24 and does not require the interleaving of spiral posts that is present in Example 3. The largest PBG occurs (see FIG. 26) when [L,c,r]=[0.45,1.43, 0.395] in units the seed post separation a and the corresponding 3-d photonic band gap spans 22.3% of the center frequency when the material surrounding the air square spiral posts has a dielectric constant of 11.9, corresponding to silicon. This structure has an overall air volume filling fraction of approximately 81%. The arms of this spiral structure are related (but not identical) to lines connecting the nearest neighbor points of a diamond lattice. Said square spiral PBG material belongs to the island Inverse (1,0,0)-diamond-GLAD-1.

Example 6

Direct Square Spiral Structure: (1,0,0)-Diamond-GLAD-3

Figure 29:
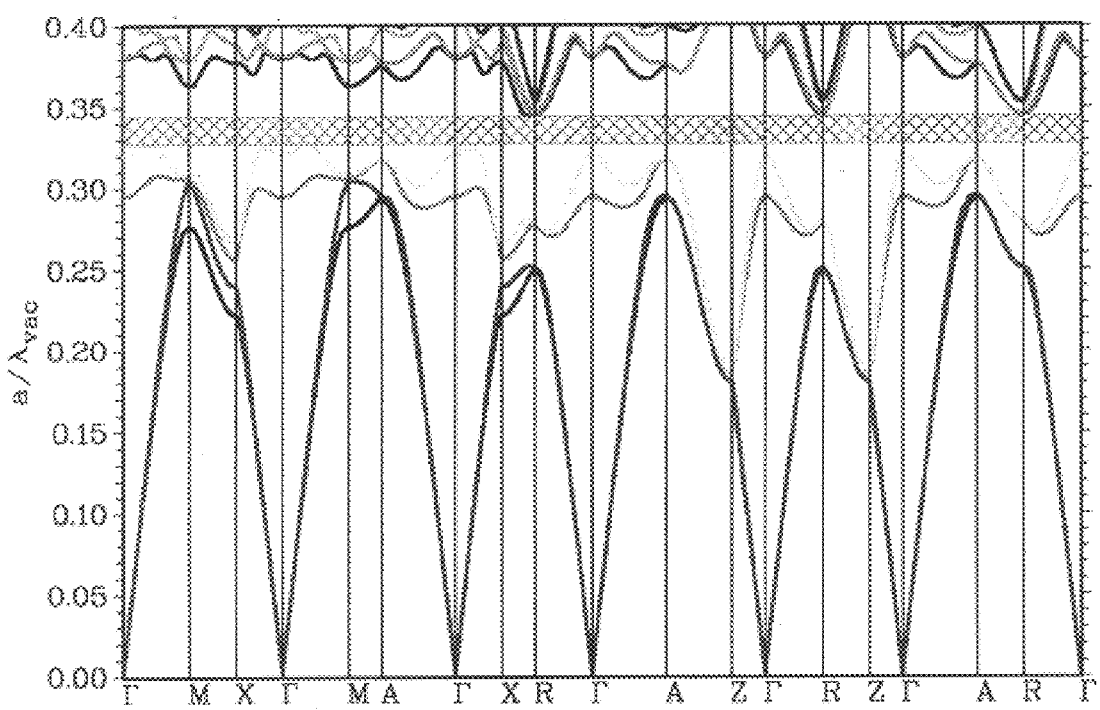
FIG. 29 shows the band structure for the (1,0,0)-diamond-GLAD-3 crystal characterized by [L,c,r]=[0.8,1.4,0.23] where the lengths are measured in units of a, the lattice constant. The dielectric constant of the spirals is 11.9. The relative size of the full PBG is 5.1% and is centered at a wavelength $\lambda_0$ given by $a/\lambda_0$=0.34 in this case.

In analogy to Example 1, we identify an "island" of square spiral photonic band gap materials whose arm length, L, (projected onto the plane perpendicular to the z-axis) in the optimal case is less than the spacing between seed posts on the substrate. The band structure is depicted in FIG. 29 when [L,c,r]=[0.8,1.4, 0.23] in units the seed post separation a and the corresponding 3-d photonic band gap spans 5.1% of the center frequency when the square spiral posts have a dielectric constant of 11.9, corresponding to silicon. The arms of this spiral structure are related (but not identical) to lines connecting the third nearest neighbor points of a diamond lattice. Said square spiral PBG material belongs to the island (1,0,0)-diamond-GLAD-3.

Example 7

Inverse Square Spiral Structure: (1,0,0)-Diamond-GLAD-3

Figure 30:
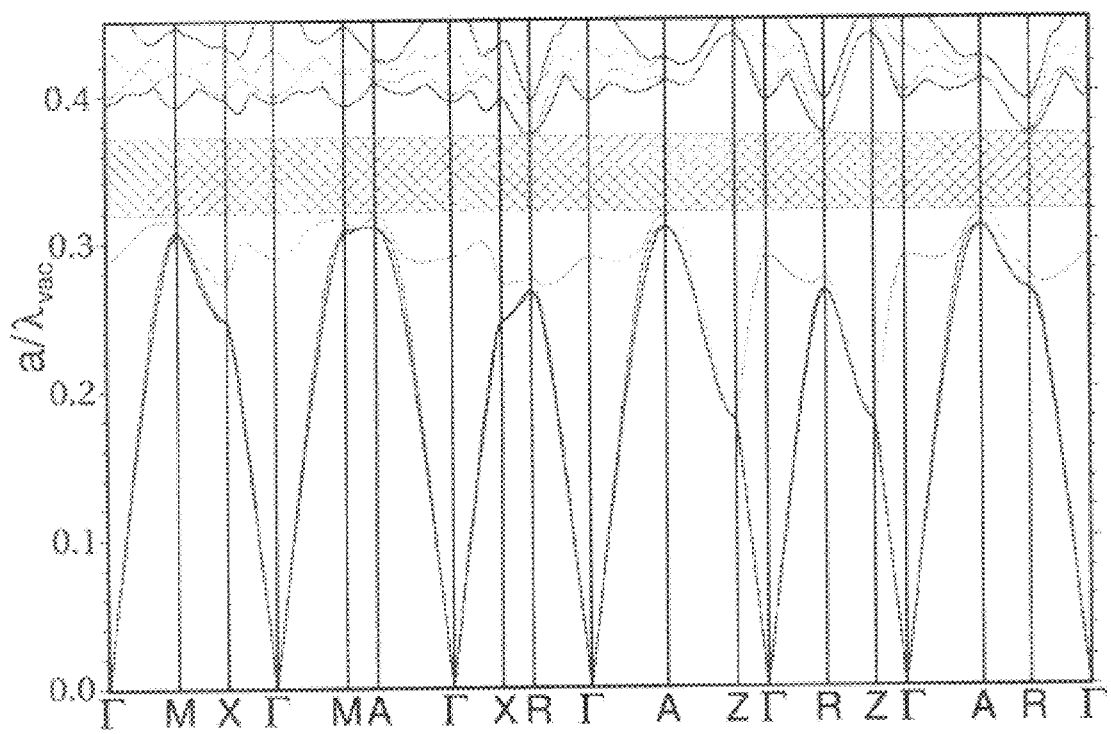
FIG. 30 shows the band structure for the Inverse (1,0,0)-diamond-GLAD-3 crystal with circular cross section square spiral arms characterized by [L,c,r]=[1.5,1.6,0.3] where the lengths am measured in units of a, the lattice constant. The dielectric constant of the background material is 11.9. The relative size of the full PBG is 14.8% and is centered at a wavelength $\lambda_0$ given by $a/\lambda_0$=0.35 in this case.

In analogy to Example 3, we identify an "island" of Inverse square spiral photonic band gap materials whose arm length, L, (projected onto the plane perpendicular to the z-axis) in the optimal case is made of air and is greater than the spacing between seed posts on the substrate. The band structure is depicted in FIG. 30 when [L,c,r]=[1.5,1.6, 0.3] in units the seed post separation a and the corresponding 3-d photonic band gap spans 14.8% of the center frequency when the material surrounding the air square spiral posts has a dielectric constant of 11.9, corresponding to silicon. The arms of this spiral structure are related (but not identical) to lines connecting the third nearest neighbor points of a diamond lattice. Said square spiral PBG material belongs to the island Inverse (1,0,0)-diamond-GLAD-3.

Example 8

Square Spiral PBG Material with Non-Circular Arm Cross-Section

Examples 1,3,4, and 5 describe square spirals crystals where the spiral arms have a circular cross section. In another embodiment of this invention, said arms have non-circular cross-sections, including (but not limited to) rectangular and square cross sections. For arms with square cross sections, the positions of the spirals is the same as those described in Examples 1,3,4, and 5. The edges of the square cross section have length e measured in units of the separation between seed posts, a. The two PBG "islands" found previously for (1,0,0)-diamond-GLAD-1 and (1,0,0)-diamond-GLAD-3 (for circular cross section spiral arms) occur in the case of square cross-section arms (see FIG. 24). The largest PBG in the "island" (1,0,0)-diamond-GLAD-1 occurs for a structure characterized by [L,c,e]=[0.75, 1.43, 0.35] and, assuming that the posts are made of a material with refractive index of 3.45, it has a PBG of 15.1% relative to the center frequency of the PBG. The largest PBG in the "island" (1,0,0)-diamond-GLAD-5 occurs for a structure characterized by [L,c,e]=[1.65,1.25,0.225] and it has a PBG of 15.4% relative to the center frequency. The spiral arm growth angles corresponding to these two optimized PBG structures are 64° and 79° respectively, relative to the z-axis . The gap size is less sensitive to the pitch of the spirals, c, than the other two parameters, L and e.

Figure 27:
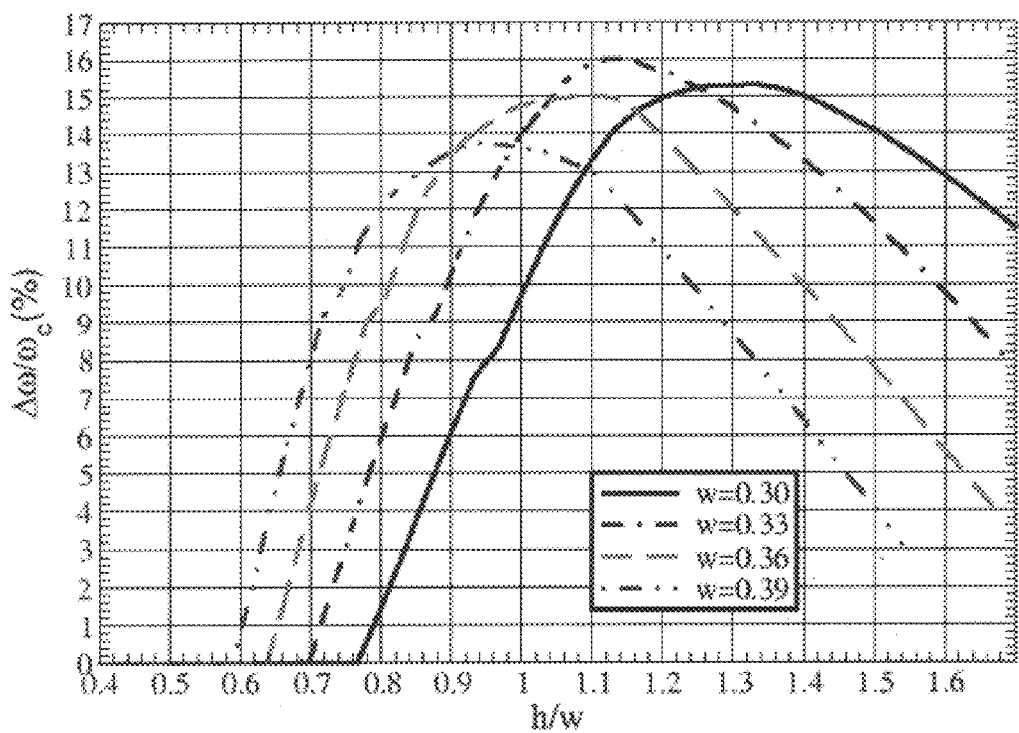
FIG. 27 shows the variation of the full PBG (measured In %) with the shape of the cross section for a direct (1,0,0) dIamond GLAD-1 crystal made from square spirals with rectangular cross section. The crystal is characterized by [L,c]=[0.75,1.43]. The width of the cross section is the length of the rectangle edge which is parallel to the xy plane.

A further embodiment of this invention consists of deforming the cross sectional profile (said cross section to be obtained by cutting the spiral arm with a plane normal to the axis of the arm) of the spiral arms of the photonic crystal into a rectangular shape whose side lengths are unequal. The distortion of the square cross section into a rectangular shape can in some instances lead to a larger PBG than that obtained by an optimized square cross section. By way of illustration we present in FIG. 27 the size of the 3-d PBG for spiral arms with rectangular side lengths h and w as a function of the aspect ratio h/w in the case of the (1,0,0)-diamond-GLAD-1 structure. Here w is the width of the rectangle defined as the length of the edge which is parallel to the xy plane and h is the height of the rectangle. It is seen in FIG. 27 that photonic band gaps as large as 16% of the center frequency are achieved for the (1,0,0)-diamond GLAD-1 structure with arms of rectangular cross section made of silicon.

Example 9

Direct Square Spiral Structure: (1,0,0)-FCC-GLAD-1

Figure 31:
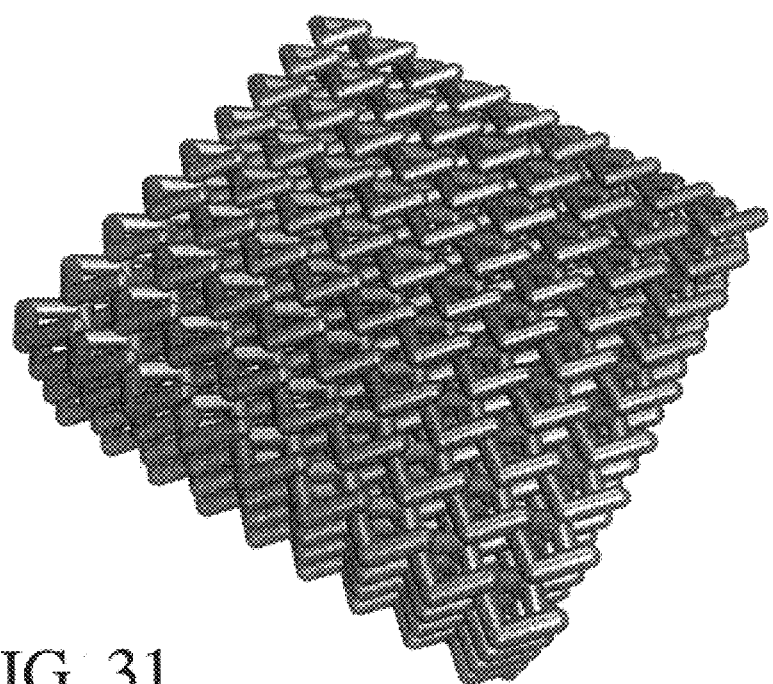
FIG. 31 shows a perspective view of a portion of a "square spirals" photonic crystal (1,0,0)-FCC-GLAD-1 constructed according to the present invention. The individual square spiral strands are rotated by an angle of 45° relative to the square lattice of seed posts on the substrate. The spiral strands are described In FIG. 5.
Figure 32:
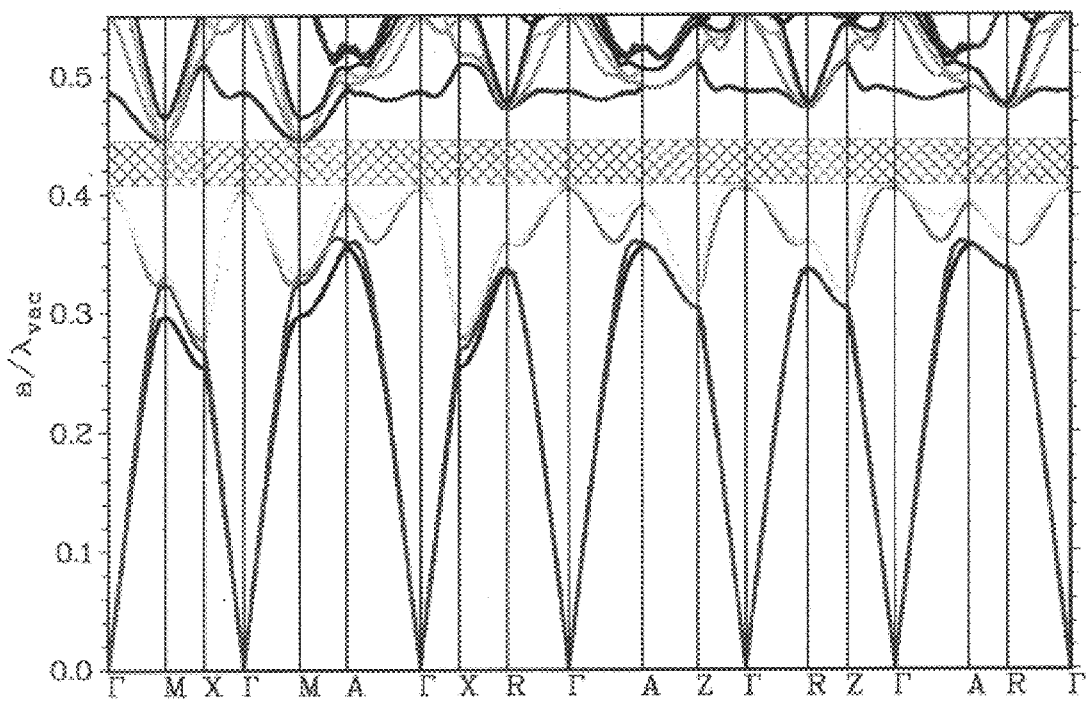
FIG. 32 shows the band structure for a (1,0,0)-FCC-GLAD-1 crystal with circular cross section square spiral arms characterized by [L,c,r]=[0.75,0.83.0.17] where the lengths am measured In units of a, the lattice constant. The dielectric constant of the spirals is 11.9. The relative size of the full PBG is 8.8% and is centered at a wavelength $\lambda_0$ given by $a/\lambda_0$=0.43 in this case.

Square spiral based photonic band gap materials are not limited to those originating from a diamond lattice template. The face center cubic (FCC) crystal provides an alternative embodiment of the present invention in which a sizeable 3-d PBG is obtained by placing seed posts on a square lattice of points obtained from the intersection of a plane normal to the (1,0,0) axis and the FCC lattice and growing square spiral posts whose arms lie in the vicinity of the straight line paths between nearest neighbor points of the FCC lattice. This is depicted in FIG. 31. The spiral posts in the present example appear to be rotated by 45° about the z-axis when compared visually with the PBG material (1,0,0)-diamond-GLAD-1 described in Example 4. In analogy to Example 4, we identify an "island" of square spiral photonic band gap materials whose arm length, L, (projected onto the plane perpendicular to the z-axis) in the optimal case is less than the spacing between seed posts on the substrate. The corresponding band structure is depicted in FIG. 32. A moderate PBG occurs when [L,c,r]=[0.75, 0.83, 0.17] in units the seed post separation a and the corresponding 3-d photonic band gap spans 8.8% of the center frequency when the square spiral posts have a dielectric constant of 11.9, corresponding to silicon. The arms of this spiral structure are related to lines connecting the nearest neighbor points of the FCC lattice but involve a very large (tetragonal) compression of the spiral posts (by roughly a factor of the square root of 8) in the vertical direction. Said square spiral PBG material belongs to the island (1,0,0)-FCC-GLAD-1.

Example 10

Inverse Square Spiral Structure: Inverse (1,0,0)-FCC-GLAD-1

Figure 33:
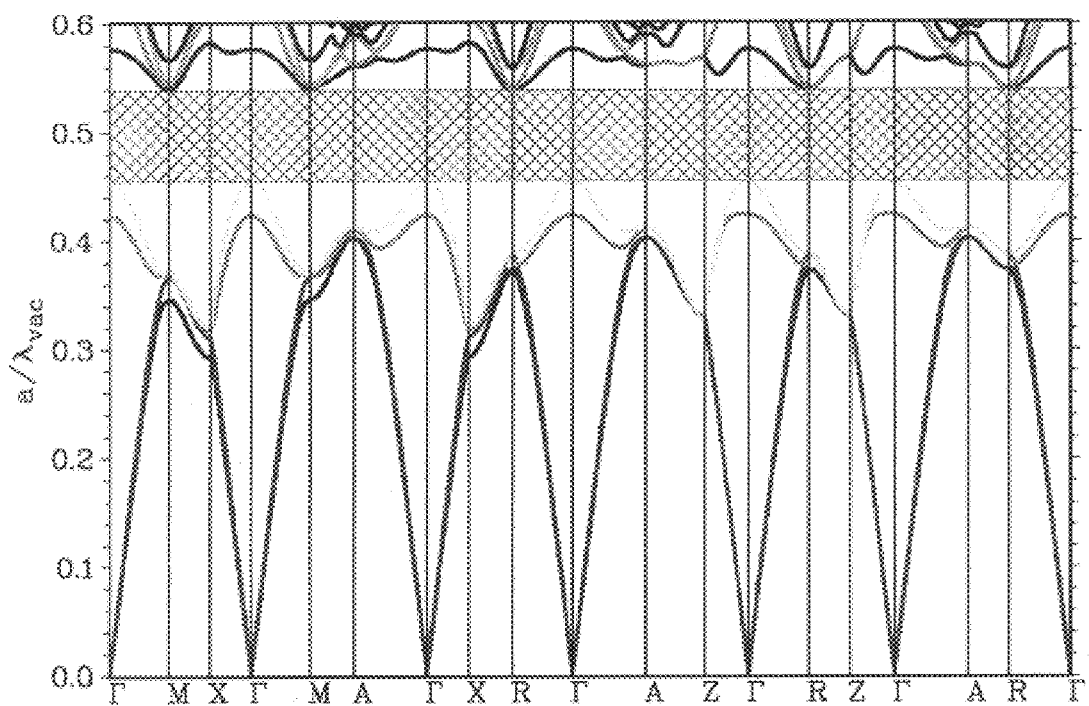
FIG. 33 shows the band structure for the inverse (1,0,0) FCC GLAD-1 square spiral photonic crystal characterized by [L,c,r]=[0.61,0.94,0.32] where the lengths are measured in units of a, the lattice constant. The dielectric constant of the background materiel is 11.9. The relative size of the full PBG is 17.1% and is centered at a wavelength $\lambda_0$ given by $a/\lambda_0=0.50$ in this case.
Figure 34A:
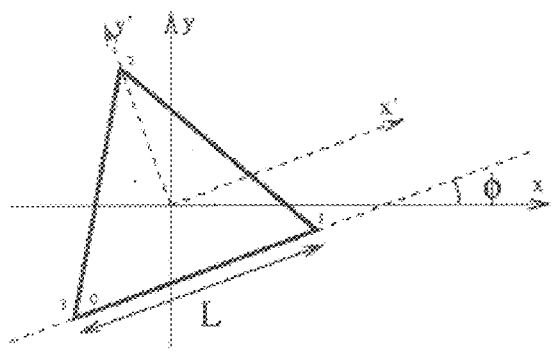
FIG. 34 describes the honeycomb lattice and the building blocks for (1,1,1) DD3 GLAD-n crystal. The building blocks are triangular spirals which are characterized by length L. [see (a) for a top view down the z axis] and pitch c [see (b) for a side view up the y' axls]. The triangular spiral is also characterized by the angle of rotation $\phi$ [see (a)], which describes the rotation of the spirals relative to the substrate. The position of the seeds is illustrated in (c). The seeds are located at all the vertices of the honeycomb lattice (the blue squares). Because the honeycomb lattice is not a Bravais lattice, in the theoretical characterization of this type of crystal we use the triangular laffice of lattice constant a (outlined with thick lines in. (c)) with a basis which consists of two lattice positions situated at $\pm a/2\sqrt{3}$. Picture (d) shows an overview of one helical strand.
Figure 34B:
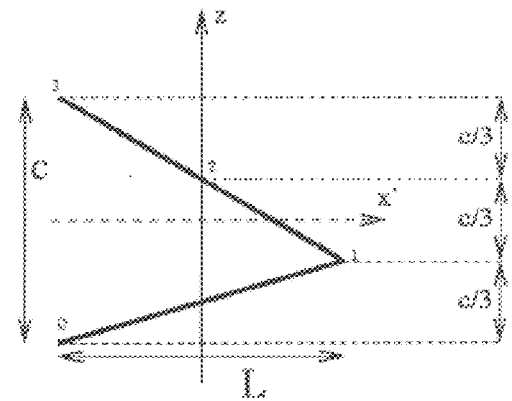
Figure 34C:
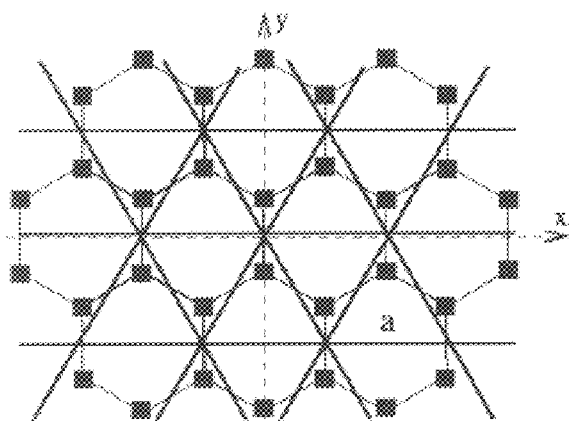
Figure 34D:

In analogy to Example 5 and as an extension of Example 9, we identify an "island" of Inverse square spiral photonic band gap materials consisting of air spirals in a high refractive index background. The arm length, L, (projected onto the plane perpendicular to the z-axis) of the air spirals, in the optimal case, is less than the spacing between seed posts on the substrate. The corresponding band structure is depicted in FIG. 33. A sizeable PBG occurs when [L,c,r]=[0.67, 0.94, 0.32] in units the seed post separation a and the corresponding 3-d photonic band gap spans 17.1% of the center frequency when the square spiral posts have a dielectric constant of 11.9, corresponding to silicon. The arms of this spiral structure are related to lines connecting the nearest neighbor points of the FCC lattice but involve a very large (tetragonal) compression of the spiral posts in the vertical direction as described in Example 9. Said square spiral PBG material belongs to the island Inverse (1,0,0)-FCC-GLAD-1.

Example 11

Direct Triangular Spiral Structure: (1,1,1)-DD3-GLAD-1

Spiral photonic crystals exhibiting a complete 3-d photonic band which can be manufactured by a GLAD technique are not limited to square spiral posts but may involve spiral posts with other shapes. Said spiral photonic crystals are also not limited to those based on a diamond lattice template or an FCC lattice template. In another embodiment of the present invention, we describe a PBG material consisting of a plurality of triangular spiral posts which are grown on a substrate with a honeycomb lattice of seed posts. This is depicted in FIG. 34. A lattice of triangular spirals can be formed by joining the nearest neighbor lattice points of a distorted diamond (DD3) lattice, said distorted diamond lattice consisting of the set of points of an FCC lattice with cubic lattice constant p and the set of points obtained from said FCC lattice by adding the basis vector (p/3, p/3, p/3). This is distinct from the diamond lattice for which the corresponding basis vector is (p/4, p/4,p/4). An "island" of PBG materials is then obtained by further variation of the spiral arms and elbows from the points of said distorted diamond lattice.

Figure 35:
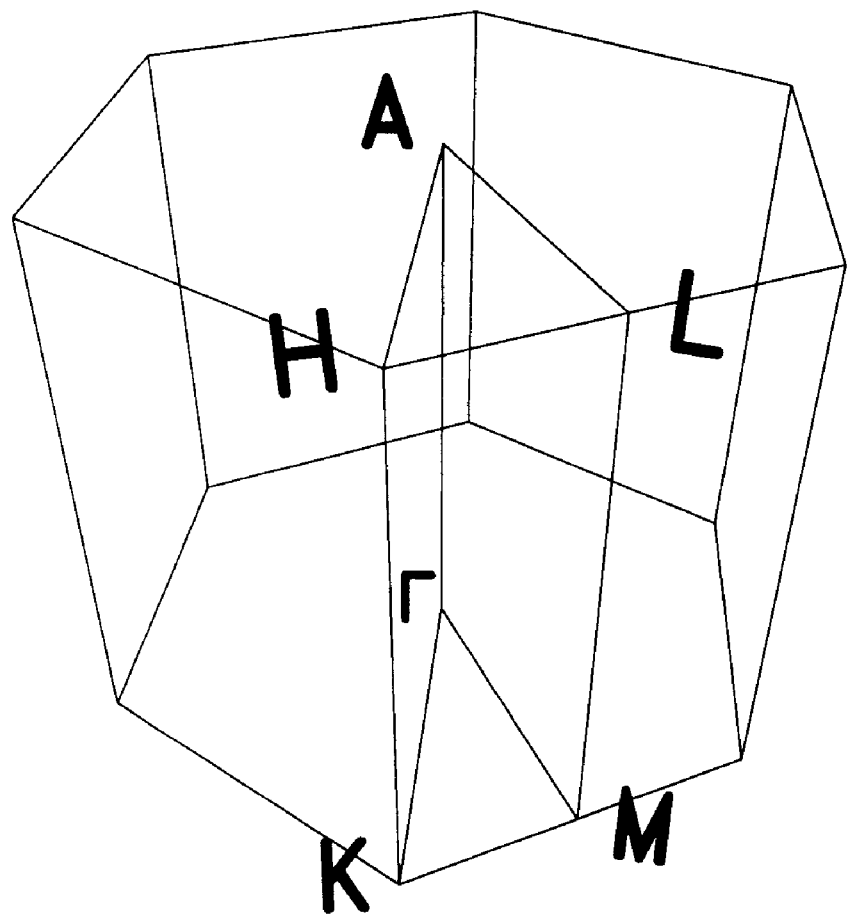
FIG. 35 shows the positions of the high symmetry points in the Brllouin zone of a hexagonal lattice.
Figure 36:
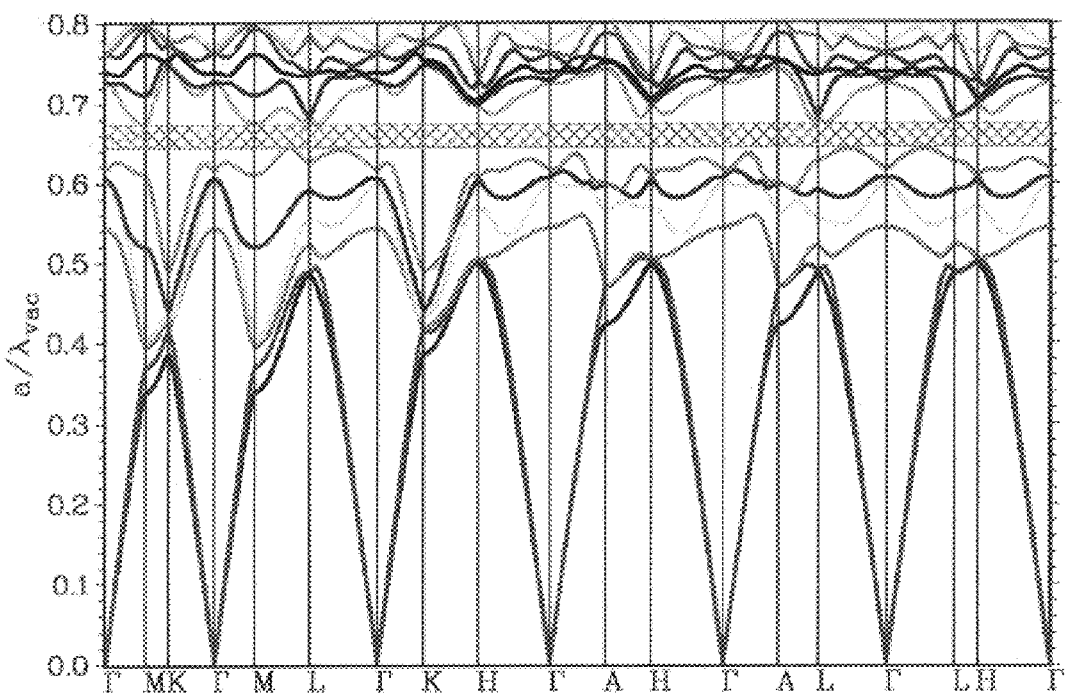
FIG. 36 shows the band structure for the (1,1,1) DOS GLAD-1 crystal characterized by [L.c.r]=[0.62,0.63,0.1] where the length is measured in units of a, the hexagonal lattice constant. The positions of the high symmetry points are shown in FIG. 35. A full PBG of relative size 4.6% opens between bands 6 and 7 in the case of spirals made from a material whose dielectric constant is 11.9. The PBG is centered at a wavelength $\lambda_0$ given by $a/\lambda_0=0.66$.

In analogy to Example 4, we identify an "island" of triangular spiral photonic band gap materials whose arm length, L, (projected onto the plane perpendicular to the z-axls) in the optimal case is less than the spacing between seed posts. A modest PBG occurs when [L.c.r]=[0.62,0.63, 0.1] in units the seed post separation a and the corresponding 3-d photonic band gap spans 4.6% of the center frequency when the triangular spiral posts have a dielectric constant of 11.9, corresponding to silicon (see FIG. 36). The positions of the symmetry points used in FIG. 36 rem illustrated in FIG. 35. Said triangular spiral PBG material belongs to the island (1,1,1)-DDS-GLAD-1.

Example 12

Inverse Triangular Spiral Structure: Inverse (1,1,1)-DD3-GLAD-1

Figure 37:
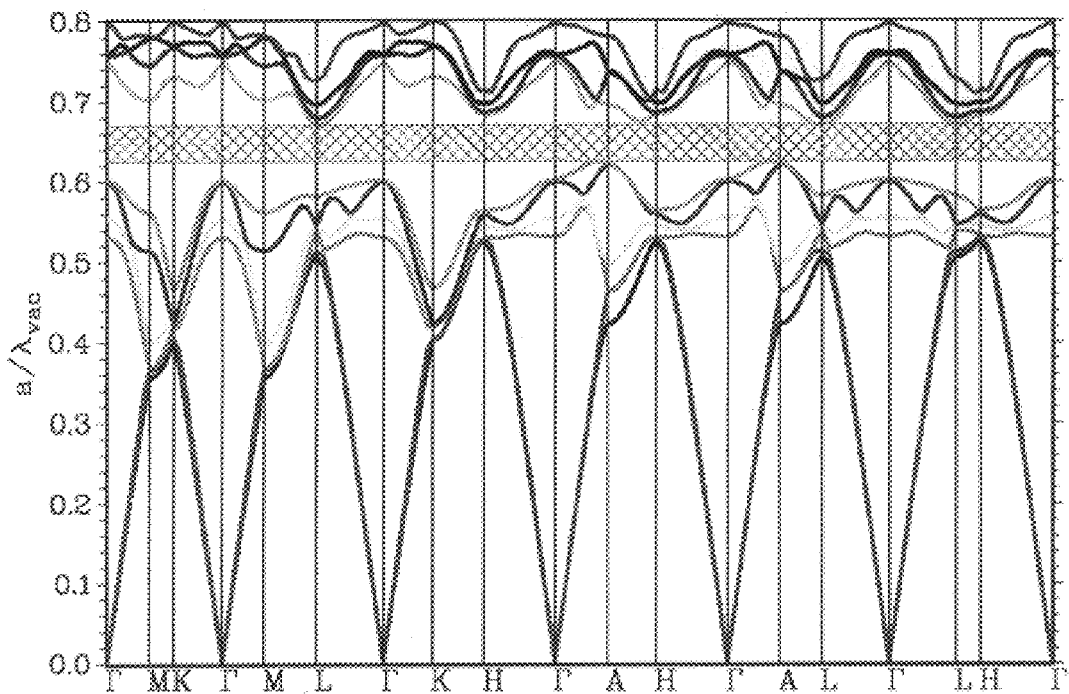
FIG. 37 shows the band structure for the inverse (1,1,1)-DD3-GLAD-1 crystal characterized by [L,c,r]=[0.93,0.7, 0.2] where the length is measured in units of a, the hexagonal lattice constant. The positions of the high symmetry points are shown in FIG. 35. A full PBG of relative size 7.1% opens between bands Band 7 in the case of spirals made from a material whose dielectric constant is 11.9. The PBG is centered at a wavelength $\pi_0$ given by $a/\lambda=0.65$.

The inverse structure corresponding to Example 11, involves a honeycomb lattice of triangular air spirals embedded in a high refractive index background. In analogy to Example 5, we identify an "island" of triangular spiral photonic band gap materials whose arm length, L, (projected onto the plane perpendicular to the z-axis) in the optimal case is less than the spacing between seed posts. A modest PBG occurs when [L,c,r]=[0.93,0.7,0.2] in units the seed post separation a and the corresponding 3-d photonic band gap spans 7.1% of the center frequency when the triangular spiral posts have a dielectric constant of 11.9, corresponding to silicon. The photonic band structure corresponding this photonic crystal is shown in FIG. 37. Said triangular spiral PBG material, belongs to the island Inverse (1,1,1)-DD3-GLAD-1.

Example 13

Planar Waveguides within a Spiral PBG Material

Photonic band gap materials based on spiral posts as described in this invention are useful for the manufacture of two-dimensional (planar) optical waveguides involving the confinement and guiding of light within a thin dielectric membrane whose thickness (extent in the z-direction) is a fraction of the length c. Said membrane (planar waveguide) can be manufactured using the GLAD method by terminating the growth of the spiral posts with a "capping layer". Said capping layer is obtained by varying the deposition conditions at a selected height of the spiral posts such that that arm (cross-sectional) radius r exceeds the spacing a between seed posts. This leads to coalescence of the spiral posts (over a preselected length interval along the z-direction) into a solid dielectric slab. The upper surface of said slab (dielectric membrane) can be used as a secondary substrate from which to grow a further lattice of spiral posts. In this manner, the dielectric membrane is sandwiched between two photonic band gap materials, one below the membrane and one above the membrane. Said dielectric membrane acts as a defect within the otherwise periodic photonic crystal, allowing light to propagate within the membrane over the range of frequencies of the surrounding PBG. This light is confined (localized) in the (vertical) z-direction.

Example 14

Integrated Optical Circuitry within a 3-d Spiral PBG Material

The spiral photonic band gap materials described in this invention are useful for the micro-fabrication of planar integrated optical circuits. As described in Example 13, a membrane (planar waveguide) can be manufactured using the GLAD method by terminating the growth of the spiral posts with a "capping layer". Said capping layer is obtained by varying the deposition conditions at a selected height of the spiral posts such that that arm (cross-sectional) radius r exceeds the spacing a between seed posts. This leads to coalescence of the spiral posts (over a preselected length interval along the z-direction) into a solid dielectric slab. The membrane can be further patterned by the selective etching (by means of electron beam lithography or some other drilling technique) of an array of holes that pass through the entire thickness of the membrane. By way of illustration, said array of holes may take the form of a two-dimensional periodic lattice and the dielectric membrane may comprise a two-dimensional photonic crystal which resides in the capping layer of the spiral. Said two-dimensional array of holes can be patterned with preselected "defects" such as missing rows of holes (line defects) and isolated missing holes (point defects) which act as linear optical waveguides and optical micro-cavities, respectively, or some combination of these and other defects. Said combination of defects can provide an optical micro-circuit for light within said two-dimensional dielectric membrane. After said patterning of two-dimensional micro-circuitry is completed, another spiral PBG material can be deposited on the upper surface of said two-dimensional dielectric membrane, leading to a sandwich structure in which said two-dimensional optical micro-circuit is sandwiched above and below by three-dimensional PBG materials. In this manner, light propagating within the two-dimensional optical micro-chip (patterned dielectric membrane) is confined and cannot "leak" in the vertical direction. This is an improvement over simple two dimensional photonic crystal membrane structures that are sandwiched above and below by air or by a material with uniform refractive index, in which there are both "guided" optical modes and "leaky" optical modes which can escape in the z-direction. In other words, the present invention can be utilized to drastically reduce losses in a two-dimensional optical micro-chip by eliminating leakage of light into the third dimension (z-direction).

In summary, the present invention provides a set of new classes of photonic crystals having complete and large photonic bandgaps and which are amenable to inexpensive, large scale manufacturing These PBG materials are highly robust to the effects of disorder. The photonic crystals have a tetragonal or other lattice symmetry and are comprised of a lattice of square or other multi-sided spiral posts of a high refractive index material in a low index background in which all said spiral posts wind together in-phase with each other. The corresponding inverse structure consisting of a lattice of low refractive index posts in a high refractive index background has an even larger PBG.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A photonic crystal, comprising:
  a three dimensional crystal lattice including a plurality of spiral posts of a selected polygonal shape having a first refractive index arranged in a material having a second refractive index, said first and second refractive indexes being sufficiently different from each other so that said photonic crystal has a complete three-dimensional photonic bandgap.

2. The photonic crystal according to claim 1 wherein said plurality of spiral posts are disposed in a substantially periodic arrangement in said second material.

3. The photonic crystal according to claim 2 wherein said polygon shape is selected from the group consisting of square, triangle, rectangle, rhombus, or parallelopiped.

4. The photonic crystal according to claim 3 wherein said three dimensional crystal lattice has a tetragonal symmetry.

5. The photonic crystal according to claim 4 wherein a ratio between said first and second refractive indexes is at least about 2.2.

6. The photonic crystal according to claim 3 wherein said three dimensional crystal lattice has a hexagonal symmetry.

7. The photonic crystal according to claim 6 wherein a ratio between said first and second refractive indexes is at least about 2.2.

8. The photonic crystal according to claim 7 wherein said lattice having tetragonal or hexagonal symmetry includes a lattice constant c in a z-direction and a lattice constant a in the transverse xy plane, and wherein each of said spiral posts wind about a z-axis and have a pitch equal to said lattice constant c.

9. The photonic crystal according to claim 3 wherein each of said spiral posts begin on a two-dimensional lattice of seed posts of lattice constant a, wherein each of said spiral posts have substantially the same orientation with respect to each other, and wherein each of said spiral posts wind in phase with each other.

10. The photonic crystal according to claim 9 wherein said lattice having tetragonal or hexagonal symmetry includes a lattice constant c in a z-direction and a lattice constant a in the transverse xy plane, and wherein each of said spiral posts wind about a z-axis and have a pitch equal to said lattice constant c.

11. The photonic crystal according to claim 3 wherein each spiral post includes a plurality of loop segments joined end-to-end to form said spiral posts, each loop segment having a polygonal transverse cross section with an edge of transverse length L.

12. The photonic crystal according to claim 11 wherein said lattice having tetragonal or hexagonal symmetry includes a lattice constant c in a z-direction and a lattice constant a in the transverse xy plane, and wherein each of said spiral posts wind about a z-axis and have a pitch equal to said lattice constant c.

13. The photonic crystal according to claim 12 wherein each arm of the spiral post has a circular cross section of radius r.

14. The photonic crystal according to claim 13 wherein each spiral post is a square spiral post with transverse arm length L and L is in a range from about 1.2a to about 1.8a, c is in a range from about 1.0a to about 2.5a, r is in a range from about 0.08a to about 0.4a, wherein a is the lattice constant of the two-dimensional square array of seed posts, and wherein said photonic crystal is associated with an island in a parameter space [L,c,r] labeled as (1,0,0)-diamond-GLAD-5.

15. The photonic crystal according to claim 13 wherein each spiral post is a rotated square spiral post with transverse arm length L and L is in a range from about 0.6a to about 1.0a, c is in a range from about 1.0a to about 2.0a, r is in a range from about 0.15a to about 0.25a, wherein a is the lattice constant of the square array of seed posts, and wherein said photonic crystal is associated with an island in a parameter space [L,c,r] labeled as (1,0,0)-diamond-GLAD-3.

16. The photonic crystal according to claim 13 wherein each spiral post is a square spiral post with transverse arm length L and L is in a range from about 0.5a to about 1.0a, c is in a range from about 0.8a to about 2.5a, r is in a range from about 0.08a to about 0.4a, wherein a is the lattice constant of the square array of seed posts, and wherein said photonic crystal is associated with the "island" in a parameter space [L,c,r] labeled as (1,0,0)-diamond-GLAD-1.

17. The photonic crystal according to claim 13 wherein each spiral post is a rotated square spiral post with transverse arm length L and L is in a range from about 0.5a to about 1.0a, c is in a range from about 0.7a to about 2.0a, r is in a range from about 0.1a to about 0.25a, wherein a is the lattice constant of the square array of seed posts. Said photonic crystal is associated with the "island" in the parameter space [L,c,r] labeled as (1,0,0)-FCC-GLAD-1.

18. The photonic crystal according to claim 13 wherein said spiral is triangular spiral with transverse arm length L and L is in a range from about 0.5a to about 1.0a, c is in a range from about 0.5a to about 1.5a, r is In a range from about 0.05a to about 0.3a, wherein a is the lattice constant of the honeycomb array of seed posts. Said photonic crystal is associated with the "island" in the parameter space [L,c,r] labeled as (1,1,1)-DD3-GLAD-1.

19. The photonic crystal according to claim 12 wherein each arm of the spiral post has a polygonal cross section.

20. The photonic crystal according to claim 19 wherein each arm of the spiral post has a square cross section of side length e.

21. The photonic crystal according to claim 20 wherein each arm of the spiral post has a rectangular cross section with sides of length w and h.

22. The photonic crystal according to claim 21 wherein each spiral post is a square spiral post with transverse arm length L and L is in a range from about 1.2a to about 1.8a, c is in a range from about 1a to about 2.5a, e, h, and w are in a range from about 0.15a to about 0.45a, wherein a is the lattice constant of the two-dimensional square array of seed posts, and wherein said photonic crystal is associated with an island labeled as (1,0,0)-diamond-GLAD-5.

23. The photonic crystal according to claim 1 wherein a ratio between said first and second refractive indexes is at least about 2.2.

24. The photonic crystal according to claim 1 wherein said material is air and said first refractive index is greater than the refractive index of air.

25. The photonic crystal according to claim 1 wherein said material is air and said spiral posts are made of glass ($SiO_2$).

26. The photonic crystal according to claim 1 wherein said spiral posts are air and said second refractive index is greater than the refractive index of air.

27. The photonic crystal according to claim 26 wherein said lattice having tetragonal or hexagonal symmetry includes a lattice constant c in a z-direction and a lattice constant a in the transverse xy plane, and wherein each of said spiral posts wind about a z-axis and have a pitch equal to said lattice constant c.

28. The photonic crystal according to claim 27 wherein each arm of the spiral post has a circular cross section of radius r.

29. The photonic crystal according to claim 28 wherein each spiral post is a square spiral post with transverse arm length L and L is in a range from about 1.2a to about 1.8a, c is in a range from about 0.8a to about 2.2a, r is in a range from about 0.15a to about 0.45a, wherein a is the lattice constant of the square array of seed posts, and wherein said photonic crystal is associated with and island in a parameter space [L,c,r] labeled as Inverse (1,0,0)-diamond-GLAD-5.

30. The photonic crystal according to claim 28 wherein each spiral post is a rotated square spiral post with transverse arm length L and L is in a range from about 1.0a to about 2.0a, c is in a range from about 1.0a to about 2.2a, r is in a range from about 0.1a to about 0.4a, wherein a is the lattice constant of the square array of seed posts, and wherein said photonic crystal is associated with an island In a parameter space [L,c,r] labeled as Inverse (1,0,0)-diamond-GLAD-3.

31. The photonic crystal according to claim 28 wherein each spiral post is a square spiral post with transverse arm length L and L is in a range from about 0.3a to about 0.8a, c is in a range from about 0.8a to about 2.2a, r is in a range from about 0.15a to about 0.45a, wherein a is the lattice constant of the square array of seed posts, and wherein said photonic crystal is associated with an island in a parameter space [L,c,r] labeled as Inverse (1,0,0-diamond-GLAD-1.

32. The photonic crystal according to claim 28 wherein each spiral post is a rotated square spiral post with transverse arm length L and L is in a range from about 0.3a to about 1.0a, c is in a range from about 0.7a to about 1.6a, r is in a range from about 0.2a to about 0.4a, wherein a is the lattice constant of the square array of seed posts, and wherein said photonic crystal is associated with an island in a parameter space [L,c,r] labeled as Inverse (1,0,0)-FCC-GLAD-1.

33. The photonic crystal according to claim 28 wherein each spiral post is a triangular spiral post with transverse arm length L and L is in a range from about 0.7a to about 1.5a, c is in a range from about 0.5a to about 1.3a, r is in a range from about 0.1a to about 0.3a, wherein a is the lattice constant of the honeycomb array of seed posts, and wherein said photonic crystal is associated with an island in a parameter space [L,c,r] labeled as Inverse (1,1,1)-DD3-GLAD-1.

34. The photonic crystal according to claim 28 wherein said spiral posts are made of a post material having a refractive index greater than about 2.2.

35. The photonic crystal according to claim 34 wherein said post material is a semiconductor.

36. The photonic crystal according to claim 35 wherein said semiconductor is selected from the group consisting of silicon, germanium, indium phosphide, gallium arsenide and gallium phosphide.

37. The photonic crystal according to claim 36 wherein said semiconductor is silicon and said photonic crystal exhibits at least a 10% full photonic bandgap.

38. The photonic crystal according to claim 28 wherein the material with said second refractive index has a refractive index greater than about 2.2.

39. The photonic crystal according to claim 38 wherein said material is a semiconductor having a refractive index greater than about 2.2.

40. The photonic crystal according to claim 39 wherein said semiconductor is selected from the group consisting of silicon, germanium, indium phosphide, gallium arsenide and gallium phosphide.

41. The photonic crystal according to claim 40 wherein said semiconductor is silicon and said photonic crystal exhibits at least a 10% full photonic band gap.

42. The photonic crystal according to claim 1 wherein said photonic crystal is a bulk photonic crystal with $b_1 \times b_2 \times b_3$ unit cells in the x-, y-, and z-directions respectively, where $b_1$, $b_2$, $b_3 > 10$.

43. The photonic crystal according to claim 1 wherein said photonic crystal is a thin film photonic crystal with $b_1 \times b_2 \times b_3$ unit cells in the x-, y-, and z-directions respectively, where $b_1$, $b_2 > 10$ and $1 < b_3 < 10$.

44. A method of producing a photonic crystal comprising a three dimensional crystal lattice including a plurality of substantially spiral posts having a first refractive index arranged in a material having a second refractive index, said three dimensional crystal lattice having tetragonal or hexagonal symmetry, wherein said first and second refractive indexes are sufficiently different from each other so that said photonic crystal has a complete three-dimensional photonic band gap, the method comprising:
    orienting a substrate at a preselected angle to a vapor flux containing said first material and depositing said first material using glancing angle deposition onto said substrate and growing spiral posts comprising said first material which wind about a z-axis in phase.

45. The method of producing a photonic crystal according to claim 44 wherein said first material is a semiconductor having a refractive index greater than about 2.2 and said second material is air so that said spirals are spaced apart in air.

46. The method of producing a photonic crystal according to claim 45 wherein said semiconductor is selected from the group consisting of silicon, germanium, indium phosphide, gallium arsenide, gallium phosphide, and glass ($SiO_2$).

47. A method of producing a photonic crystal comprising a three dimensional crystal lattice including a plurality of substantially spiral posts made of air arranged in a material having a second refractive index, said three dimensional crystal lattice having tetragonal or hexagonal symmetry, wherein said second refractive index is sufficiently large so that said photonic crystal has a complete three-dimensional photonic band gap, the method comprising:

orienting a substrate at a preselected angle to a vapor flux containing a first material, depositing said first material using glancing angle deposition onto said substrate and growing spiral posts" comprising said first material which wind about a z-axis in phase, compressing said spiral posts as required along the z-axis by the application of heat and mechanical pressure, enlarging the arm cross section of said spiral posts through a secondary deposition process not involving GLAD to achieve a photonic crystal template, infiltrating said template with said material having a second refractive index, and selectively etching away and replacing said first material with air.

48. A photonic crystal template, comprising:

a three dimensional crystal lattice including a plurality of substantially polygonal spiral posts having a first refractive index arranged in a material having a second refractive index, such that if said first and second refractive indexes were replaced by indexes sufficiently different from each other, said photonic crystal would have a complete three-dimensional photonic bandgap.

* * * * *